(12) United States Patent
Goldfarb et al.

(10) Patent No.: US 11,932,135 B2
(45) Date of Patent: *Mar. 19, 2024

(54) HYBRID BATTERY MANAGEMENT SYSTEM

(71) Applicant: Rearden Power LLC, Las Vegas, NV (US)

(72) Inventors: Scott Goldfarb, Las Vegas, NV (US);
Jack Chaiken, Las Vegas, NV (US);
Jett Street, Las Vegas, NV (US)

(73) Assignee: Rearden Power LLC, Las Vegas, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/409,506

(22) Filed: Aug. 23, 2021

(65) Prior Publication Data
US 2022/0080853 A1 Mar. 17, 2022

Related U.S. Application Data

(63) Continuation of application No. 17/317,532, filed on May 11, 2021, now Pat. No. 11,130,422.
(Continued)

(51) Int. Cl.
B60L 1/00 (2006.01)
B60L 8/00 (2006.01)
(Continued)

(52) U.S. Cl.
CPC ............. *B60L 58/10* (2019.02); *B60L 1/00* (2013.01); *B60L 8/003* (2013.01); *B60L 8/006* (2013.01);
(Continued)

(58) Field of Classification Search
CPC ......... B63B 79/15; B63B 79/40; B63B 79/30; B63B 79/10; F03D 9/32; G01W 1/10;
(Continued)

(56) References Cited

U.S. PATENT DOCUMENTS 7,628,236 B1 * 12/2009 Brown ............... B60K 6/48
180/65.21
8,229,609 B2 * 7/2012 Bamba ............... F02D 41/062
123/41.15
(Continued)

FOREIGN PATENT DOCUMENTS

JP 200-125407 A 4/2000
JP 2006-339165 A 12/2006
KR 10-2012-0071222 A 7/2012

OTHER PUBLICATIONS

Li et al., A Bayesian Approach to Battery Prognostics and Health Management, 2017, IEEE, p. 151-173 (Year: 2017).*
(Continued)

Primary Examiner — McDieunel Marc
(74) Attorney, Agent, or Firm — Pillsbury Winthrop Shaw Pittman, LLP

(57) ABSTRACT

Provided is a device configured to determine a power capacity of a battery of a vehicle, predict a first set of values indicative of amounts of power to be stored during a time interval by the battery, the power being generated by a renewable energy generator carried by the vehicle, and predict a second set of values indicative of amounts of energy to be consumed from the battery during the time interval based on previous energy consumption by the vehicle. The device is also configured to determine a score based on the power capacity, the first set of values, and the second set of values. The system is also configured to determine whether the score satisfies a threshold and, in response to a determination that the score satisfies the threshold, activate an internal combustion engine to charge to the battery.

20 Claims, 5 Drawing Sheets

Related U.S. Application Data

(60) Provisional application No. 63/024,396, filed on May 13, 2020.

(51) Int. Cl.

| | |
|---|---|
| *B60L 50/60* | (2019.01) |
| *B60L 53/24* | (2019.01) |
| *B60L 58/10* | (2019.01) |
| *B63B 79/15* | (2020.01) |
| *B63B 79/30* | (2020.01) |
| *B63B 79/40* | (2020.01) |
| *F02D 29/06* | (2006.01) |
| *F03D 9/32* | (2016.01) |
| *G01P 5/00* | (2006.01) |
| *G01R 31/36* | (2020.01) |
| *G01W 1/10* | (2006.01) |

(52) U.S. Cl.
CPC ............ *B60L 50/60* (2019.02); *B60L 53/24* (2019.02); *B63B 79/15* (2020.01); *B63B 79/30* (2020.01); *B63B 79/40* (2020.01); *F02D 29/06* (2013.01); *F03D 9/32* (2016.05); *G01P 5/00* (2013.01); *G01R 31/3647* (2019.01); *G01W 1/10* (2013.01); *B60L 2200/32* (2013.01); *B60L 2240/62* (2013.01); *B60Y 2200/92* (2013.01); *F05B 2220/706* (2013.01); *F05B 2240/931* (2013.01)

(58) Field of Classification Search
CPC ..... G01R 31/3647; F02D 29/06; B60L 53/24; B60L 50/60; B60L 8/003; B60L 58/10; B60L 1/00; B60L 8/006; B60L 2240/62; B60L 2200/32; G01P 5/00; F05B 2240/931; F05B 2220/706; Y02T 10/7072; Y02T 10/70; Y02T 90/14; Y02T 70/10; Y02E 10/72; B60Y 2200/92
See application file for complete search history.

(56) References Cited

U.S. PATENT DOCUMENTS

| | | | | |
|---|---|---|---|---|
| 8,249,768 | B2* | 8/2012 | Mori | B60W 10/26 |
| | | | | 701/87 |
| 8,321,082 | B2* | 11/2012 | Ando | B60W 10/06 |
| | | | | 422/177 |
| 9,878,631 | B2* | 1/2018 | Hyde | B60L 1/14 |
| 9,882,380 | B2* | 1/2018 | Sepe, Jr. | H02M 3/157 |
| 9,958,356 | B2* | 5/2018 | König | G01M 15/02 |
| 11,130,422 | B1* | 9/2021 | Goldfarb | B63B 79/15 |
| 2010/0311539 | A1* | 12/2010 | Eisele | B60W 50/082 |
| | | | | 180/65.265 |
| 2011/0127958 | A1 | 6/2011 | Ishishita et al. | |
| 2014/0077610 | A1 | 3/2014 | Zhang et al. | |

OTHER PUBLICATIONS

Ghasemzadeh et al., Power-Aware Computing in Wearable Sensor Networks: An Optimal Feature Selection, 2014, IEEE, p. 800-812 (Year: 2014).*

Tan et al., Transfer Learning With Long Short-Term Memory Network for State-of-Health Prediction of Lithium-Ion Batteries, 2019, IEEE, p. 8723-8731 (Year: 2019).*

Jacoby et al., Battery-based intrusion detection a first line of defense, 2004, IEEE, p. 272-279 (Year: 2004).*

Kang et al., Energy Management Strategy of CAES-BS-SC Hybrid Energy Storage System Based on EEMD, 2019, IEEE, p. 1409-1414 (Year: 2019).*

Aitouche et al., Robust Energy Management Control Strategy in Plug-in Hybrid Electric Vehicles, 2019, IEEE, p. 159-164 (Year: 2019).*

Gladwin et al., Viability of "second-life" use of electric and hybrid electric vehicle battery packs, 2013, IEEE, p. 1922-1927 (Year: 2013).*

Kamal et al., Real-Time Energy Management Based on the Prediction of Hybrid Vehicle's Future States, 2017, IEEE, p. 1-6 (Year: 2017).*

International Search Report and Written Opinion in related international application PCT/US2021/031814 dated Aug. 30, 2021.

* cited by examiner

HYBRID BATTERY MANAGEMENT SYSTEM

CROSS-REFERENCE TO RELATED APPLICATIONS

This patent application is a continuation of U.S. Non-Provisional patent application Ser. No. 17/317,532, titled HYBRID BATTERY MANAGEMENT SYSTEM, filed 11 May 2021. U.S. Non-Provisional patent application Ser. No. 17/317,532 claims the benefit of U.S. Provisional Patent Application 63/024,396, titled HYBRID SOLAR AND GENERATOR POWER SYSTEM FOR VEHICLES WITH BATTERY MANAGEMENT SYSTEM THAT REDUCES CARBON FOOTPRINT, filed 13 May 2020. The entire content each of the aforementioned patent-filings are hereby incorporated by reference.

BACKGROUND

A vehicle often has onboard battery systems to power various electrical components of the vehicle (e.g., to run vehicle monitoring systems, air control systems, and onboard appliances). These battery systems may be connected to a portfolio of power sources to charge a battery. Power sources may include generators powered by a fuel-consuming device, renewable energy sources (e.g., on-site solar and wind), and grid-connected outlets. A battery management system (BMS) is an electronic circuit capable of monitoring and controlling the charging and discharging of the battery.

Vehicle power production varies over time and space. The availability, quality, and price of renewable energy sources vary throughout the time of day, time of year, and according to the weather. Such variations may also be based on other factors, such as a geolocation of the renewable energy being harvested. Furthermore, vehicle energy consumption also varies over time and space. Such energy may be used in various ways, such as by operating an air conditioner, using cooking equipment, using a set of computing devices, or the like.

SUMMARY

The following is a non-exhaustive listing of some aspects of the present techniques. These and other aspects are described in the following disclosure.

Some aspects include a process that includes determining a power capacity of a battery of a vehicle and predicting a set of power outputs to be sent to the battery from a renewable energy generator carried by the vehicle during a time interval. The process also includes predicting a set of power consumption values based on a set of records indicating previous power consumption values of the vehicle and determining a score based on the power capacity, the set of power outputs, and the set of power consumption values. The process also includes determining whether the score satisfies a threshold and, in response to a determination that the score satisfies the threshold, activating an internal combustion engine to charge to the battery.

Some aspects include a tangible, non-transitory, machine-readable medium storing instructions that when executed by a data processing apparatus cause the data processing apparatus to perform operations including the above-mentioned process.

Some aspects include a system that includes one or more processors and memory storing instructions that, when executed by the processors, cause the processors to effectuate operations of the above-mentioned process.

BRIEF DESCRIPTION OF THE DRAWINGS

The above-mentioned aspects and other aspects of the present techniques will be better understood when the present application is read in view of the following figures in which like numbers indicate similar or identical elements.

Figure 1:
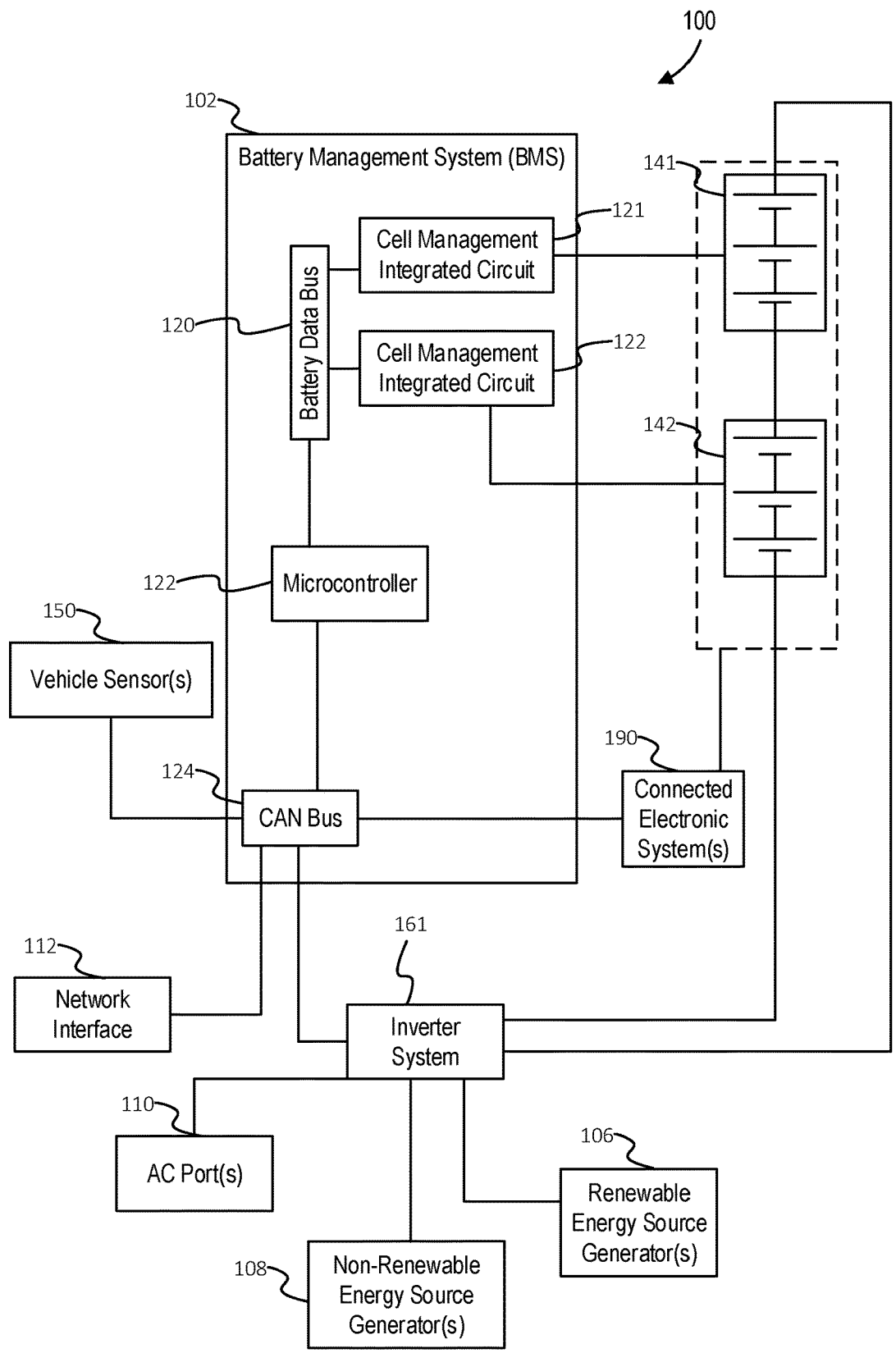
FIG. 1 is a schematic diagram of a battery management system, in accordance with some embodiments.

While the present techniques are susceptible to various modifications and alternative forms, specific embodiments thereof are shown by way of example in the drawings and will herein be described in detail. The drawings may not be to scale. It should be understood, however, that the drawings and detailed description thereto are not intended to limit the present techniques to the particular form disclosed, but to the contrary, the intention is to cover all modifications, equivalents, and alternatives falling within the spirit and scope of the present techniques as defined by the appended claims.

DETAILED DESCRIPTION

To mitigate the problems described herein, the inventors had to both invent solutions and, in some cases, just as importantly, recognize problems overlooked (or not yet foreseen) by others in the field of battery management system design. Indeed, the inventors wish to emphasize the difficulty of recognizing those problems that are nascent and will become much more apparent in the future should trends in industry continue as the inventors expect. Further, because multiple problems are addressed, it should be understood that some embodiments are problem-specific, and not all embodiments address every problem with traditional systems described herein or provide every benefit described herein. That said, improvements that solve various permutations of these problems are described below.

Many battery-management systems (BMSs) for vehicles waste fuel by failing to account for future periods of high renewable energy production, even when doing so will not affect consumption. These BMSs may apply simple logic, like that of a bang-bang controller triggered by comparing a battery's power capacity to a minimum and maximum thresholds. For example, a BMS may start an internal combustion engine (ICE) generator that consumes fuel when the reserve power capacity of a battery drops below 40% charge and continue ICE operations until the battery reaches a reserve power capacity of 90% charge. However, such simple logic fails to account for times when a substantial amount of renewable energy production is about to come back online to charge the batteries, such as during the morning as the sun appears. Thus, a BMS may inadequately privilege renewable energy production over ICE energy production, resulting in greater use of the ICE than is needed to satisfy power consumption requirements. Such a scenario may result in wasted fuel, increased carbon emissions, and the accelerated degradation of mechanical equipment.

To overcome one or more of the technical problems described in this disclosure, some embodiments may execute logic to control different amounts of energy to send to a battery from different energy sources responsive to a given state. In some embodiments, an embedded computer system may perform operations to reduce fuel consumption of vehicles capable of using both non-renewable energy generators and renewable energy generators. The set of operations may include predicting an energy surplus or energy deficit over a time interval based on a predicted amount of energy or power output generated by the generators, a state of a set of batteries, and a set of values based on a geolocation or environmental data associated with the vehicle. Some embodiments may determine a power capacity of a vehicle battery and predict a future power capacity of the battery based on a set of predicted power outputs or associated quantities of energy produced by a renewable energy generator. For example, some embodiments may obtain a geolocation of a vehicle and predict a set of power outputs equal to 1000 watts (W) sent to the battery from a solar energy generator during a time interval between 4 AM and 4 PM. Some embodiments may then predict a set of power consumption values for the same time interval based on values stored in a set of records indicating previous power consumption values of the vehicle.

Some embodiments may use the predicted values to determine a score associated with a net energy change during the time interval. In response to a determination that the score satisfies a threshold or some other criteria, some embodiments may activate the ICE or schedule an activation time for the ICE to charge the battery. As described elsewhere in this disclosure, some embodiments may perform other operations to predict a set of power outputs during a time interval. For example, some embodiments may perform operations to provide a user interface (UI) to a computing device via a set of program instructions or other data used to generate an instance of the UI on the computing device. The UI may include UI elements, such as text entry boxes, interactive calendars, sliders, radio buttons, rotating objects, or the like. As described elsewhere in this disclosure, some embodiments may permit a user to interact with the set of UI elements to determine a schedule indicating energy consumption, operational parameters for a generator, a set of environmental data, or the like.

By providing one or more of the features described in this disclosure, some embodiments may reserve power capacity for renewable energy production while maintaining a sufficient buffer of energy to serve predicted power consumption. Additionally, some embodiments may reduce carbon emissions caused by the use of the ICE to generate electricity. That said, none of the preceding (or following) should be read as a disclaimer of any subject matter, as a variety of independently useful techniques are described, and some of those techniques may be deployed to address some issues without addressing other described problems with earlier approaches. Furthermore, while some embodiments may be described as having a feature, this is not to suggest that all embodiments have this feature or that any other described feature is not also amenable to variation. For example, while some embodiments may describe the transfer of excess power to increase the performance of a computer system, some embodiments may perform operations described in this disclosure for without transferring excess power to a computer system.

FIG. 1 is a schematic diagram of a battery management system, in accordance with some embodiments. The vehicle system 100 displays a BMS 102 of a vehicle, where the BMS includes a battery data bus 120, a set of cell management integrated circuits 121-122 in communication with the battery data bus 120, a microcontroller 122, and a controller area network (CAN) bus 124. A vehicle may include a ground-based vehicle such as a bus, a recreational vehicle (RV), a sprinter van, or the like. An RV may include vehicles that are capable of traveling on the ground and includes at least one of a heating device for cooking, a water pump for bathing or biological waste removal, or a bed. A vehicle may also include a watercraft such as a boat, a ship, a ferry, or the like. A vehicle may also include an aerial vehicle such as a drone, helicopter, plane, aerostat, or the like.

The BMS 102 can read data from or control the operations of one or more electric generators, such as a set of renewable energy generators 106 or a set of non-renewable energy generators 108. The BMS 102 may a include processor, such as a microcontroller 122, microprocessor, or a central processing unit (CPU) in an ASIC or FPGA form. The microcontroller 122 may be used to obtain data from more devices via the CAN bus 124. For example, the microcontroller 122 may obtain vehicle sensor data from the set of vehicle sensors 150. Alternatively, or in addition, the microcontroller 122 may obtain weather forecast data such as an indicated solar irradiance value or other environmental data from a network interface 112 via the CAN bus 124. The BMS 102 may execute logic to perform one or more operations described in this disclosure, where the logic may be hard-wired into a chip or be programmed as software or firmware stored in volatile or non-volatile memory of the BMS 102.

As described elsewhere in this disclosure, a renewable energy generator may include generators that provide electricity from one or more renewable energy sources. For example, the set of renewable energy generators 106 may include a solar energy generator, a wind turbine, or another type of generator that converts a renewable energy source into electricity. Furthermore, as described elsewhere in this disclosure, a non-renewable energy generator may include a generator that is powered by a fuel, such as a hydrocarbon fuel source. For example, the set of non-renewable energy generators 108 may include an ICE generator that consumes hydrocarbon fluids such as gasoline, diesel gas, propane, or natural gas to generate electricity.

In some embodiments, the vehicle system 100 may include a generator controller and inverter system 161 may convert electric energy from direct current into alternating current. For example, the generator controller and inverter system 161 may include multiple inverters compatible with each generator of the set of renewable energy generators 106 and the set of non-renewable energy generators 108 to transfer energy from the set of generators 106 or 108 to the set of batteries 104 or to other electricity-consuming components of a vehicle. Additionally, the generator controller and inverter system 161 may modify or update other power sources connected to the set of batteries 104. For example, the microcontroller 122 may include instructions to operate the generator controller and inverter system 161 with the CAN bus 124. The instructions may also control which generators are used to charge the set of batteries 104 via electrical contact between the generator controller and inverter system 161, the set of generators 106 or 108, and the set of batteries 104.

In some embodiments, the BMS 102 may receive data indicating the state of the set of batteries 104 via the battery data bus 120, which may send and receive data to a battery cell 141 and a battery cell 142 of the set of batteries 104. The state of the set of batteries 104 may include a power capacity indicating the amount of energy being stored by the set of batteries 104, a maximum power capacity, a measure of battery degradation, a current, a voltage difference of the battery, or the like. As used in this disclosure, a power capacity is the usable amount of energy stored in a battery. For example, if a battery is limited to operate between 40% and 80% of a maximum power capacity by software or hardware limitations, then the power capacity, when provided in relative terms, of the battery when the battery is at the upper operational limit may be equal to 80%. As described elsewhere in this disclosure, some embodiments may determine whether or when to activate a generator based on one or more states of the set of batteries 104. Additionally, some embodiments may perform a calibration operation to update a threshold value or re-determine a value based on a change in certain state values, such calibrating a battery by changing a maximum power capacity of a battery.

While not shown in FIG. 1, some embodiments may include additional circuitry, inverters, or components to accommodate batteries having different voltages, power capacities, control systems, or the like. For example, some embodiments may perform one or more operations described in this disclosure to charge a first set of Lithium-ion (Li-Ion) batteries having a maximum power capacity of 10 kWh and a second set of lead acid batteries having a maximum power capacity of 5 kWh, where different power operations may be performed to select which set of batteries to charge or discharge. As used in this disclosure, a power capacity may indicate the amount of energy stored in a battery and may be measured in units of energy such as Watt-hours (Wh), Joules (J), calories, or the like. Alternatively, or in addition, the power capacity of a battery may be reported to a microcontroller, microprocessor or other computing device in the form of a ratio relative to a maximum power capacity of a battery, or in the form of an ordinal value, such "low" or "high."

Figure 2:
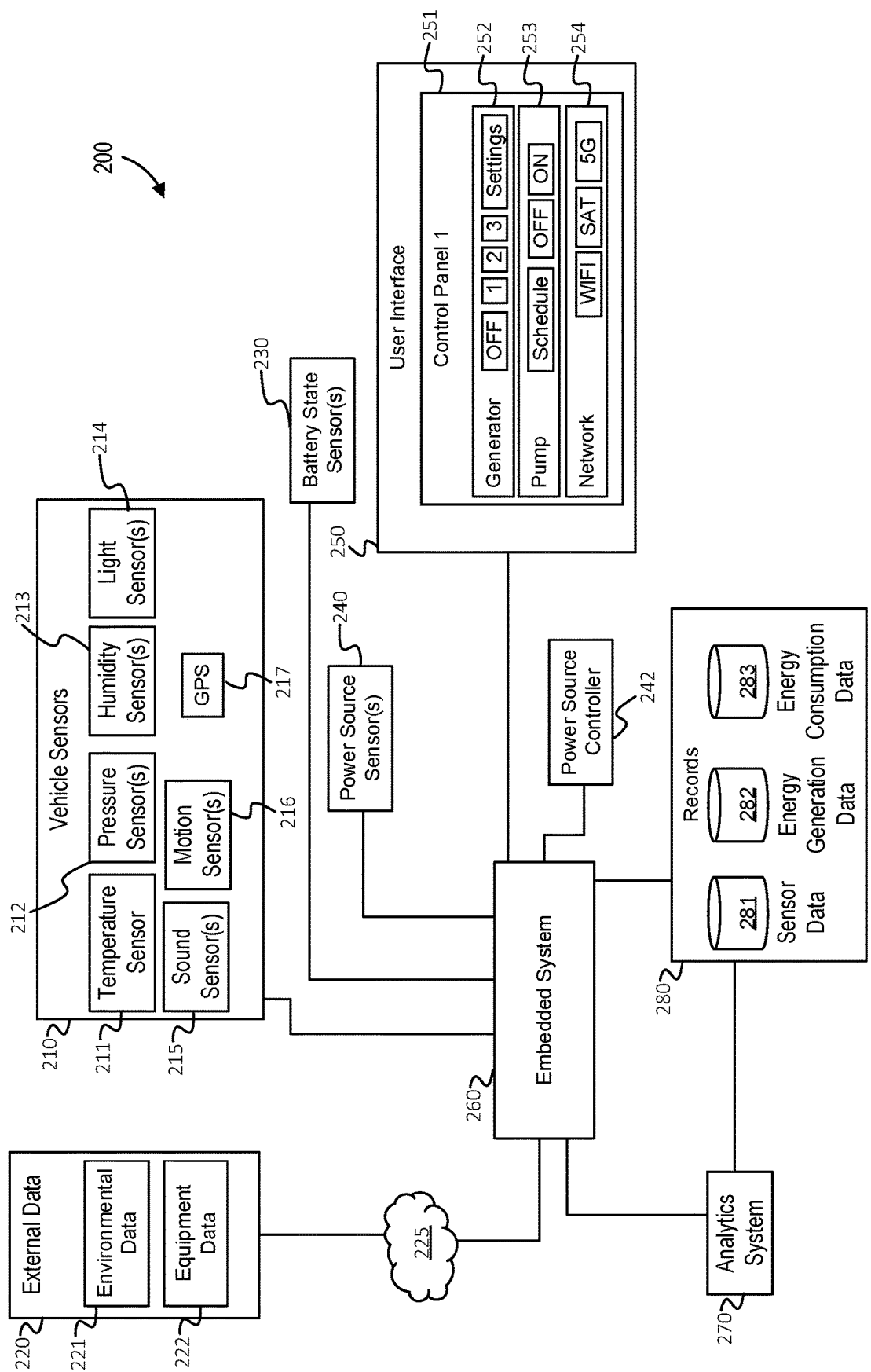
FIG. 2 illustrates a computing environment in a battery management system that may be implemented with the present techniques, in accordance with some embodiments.

FIG. 2 illustrates a computing environment in a battery management system that may be implemented with the present techniques, in accordance with some embodiments. In some embodiments, some or all of the above-describe techniques may be implemented in a computing environment 200. The computing environment 200 is able to collect data from a set of vehicle sensors 210, external data 220, a set of battery state sensors 230, a set of power source sensors 240, or user interface 250. The computing environment may collect, analyze, and respond to data with an embedded system 260, where the embedded system 260 may include an embedded processor to execute one or more operations described in this disclosure. For example, some embodiments may use an embedded processor executing instructions using a Reduced Instruction Set Computer (RISC) architecture or use other computing architecture designed for embedded processors.

The set of vehicle sensors 210 may include sensors capable of detecting data useful for characterizing a local environment of a vehicle. Such sensors may include a set of temperature sensors 211 to determine temperature data, set of pressure sensors 212 to collect pressure data, a set of humidity sensors 213 to detect a local humidity level, a set of light sensors 214 to detect an ambient light within or outside of a vehicle, or the like. As described elsewhere in this disclosure, some embodiments may use data indicating the state of a local environment around or within the vehicle to predict a power output of an electric generator or an energy consumption rate.

The set of vehicle sensors 210 may also include additional sensors such as a set of sound sensors 215, a set of motion sensors 216, or the like. The measurements made by sound sensors, motion sensors, or other sensors of a vehicle may be used to determine a number of individuals present in a vehicle, identify or otherwise characterize the users of the vehicle, or determine anomalous events within or outside the vehicle. Alternatively, or in addition, sensor data provided by the set of vehicle sensors 210 may be used to categorize a behavior of an occupant of the vehicle or predict a current or future behavior of the occupant.

The external data 220 may be provided from a set of servers, where the set of servers may provide environmental data 221 such as a weather condition, quantities related to the solar irradiance of an area, cloud coverage, wind speeds, wind direction, water current speeds, water current directions, or the like. As described elsewhere in this disclosure, some embodiments may obtain the external data by first sending a request to the server indicating a geolocation to obtain the environmental data 221 for that geolocation. Some embodiments may include one or more times with the geolocation to obtain a set of predictions of environmental data 221 at the geolocation for the one or more times. Alternatively, or in addition, the external data 220 may be provided directly from another data source, such as a satellite, another mobile computing device in communication with the vehicle, or the like.

The external data 220 may also include a set of equipment data 222, where the set of equipment data 222 may be used to predict a power consumption or a generator power output. In some embodiments, the set of equipment data 222 may include software instructions to update the operations of a renewable energy generator such as a solar panel, a non-renewable energy generator such as an ICE, a battery system, or the like. Alternatively, or in addition, the set of equipment data 222 may include calibration values that increase the accuracy of a prediction of power consumption or power generation.

The external data 220 may be provided to the embedded system 260 via a data network 225, where the data network 225 may be the Internet or a private data network. The external data 220 may be transmitted to the embedded system 260 via a set of wireless signals broadcast over a wireless network, such as a satellite Internet network, a 4G LTE network, 6G network, Wi-Fi network, or the like. Some embodiments may send data from a local memory of a computing device of the vehicle. For example, some embodiments may send data stored in the set of records 280 to a remote server or cloud computing service, where the sent may be stored, analyzed, and used to generate further instructions, such as an updated version of the set of equipment data 222. Additionally, some embodiments may include instructions to upload stored data to a remote server, cloud computing service, or other endpoint in response to a determination that the vehicle has a network connection that satisfies a set of connection criteria, such as satisfying a bandwidth threshold or satisfies a latency threshold. Alternatively, or in addition, some embodiments may delete a local version of data to create local data storage space for new measurements or user-entered data.

Some embodiments may modify requests for data based on a connection quality, where different amounts of data or types of data is provided to the embedded system 260 based on one or more measures of connection quality or capability between a vehicle and a source of the external data 220. For example, some embodiments may determine that a bandwidth between the wireless communication equipment of a vehicle and a server providing environmental data 221 is less than a bandwidth threshold and, in response, send a request for solar irradiation data consisting of four values. After the vehicle proceeds to an area that permits the wireless communication equipment of the vehicle to communicate with the server at a higher bandwidth that is greater than the bandwidth threshold, some embodiments may send a request to the server for solar radiation data consisting of 10 values. By receiving more values, some embodiments may be able to increase the accuracy of energy generation predictions. Furthermore, by configuring the requested number of values based on a connection quality measurement, some embodiments may prevent connection delays or inefficient use of limited bandwidth.

The set of battery state sensors 230 may be able to provide measurements indicating a state of a battery, such as a power capacity, a battery health, a charging rate of the battery, a discharge rate of the battery, a maximum power capacity of the battery or the like. As used in this disclosure, the term battery may refer to a single battery or a plurality of different batteries. The set of battery state sensors 230 may also provide other indicators for the state of a battery, such as a degradation of the battery, a battery failure, a maximum charging rate of a battery, or the like. Some embodiments may use one or more of the measurements provided by the set of battery state sensors 232 predict a future power capacity of a battery. As described elsewhere in this disclosure, some embodiments may use these predictions in conjunction with other predictions to determine whether or not to activate a generator, when to activate the generator, an operational parameter used to operate the generator, or the like.

The set of power source sensors 240 may include sensors for a renewable energy generator or sensors for a non-renewable energy generator. The set of power source sensors 240 may indicate the state of various aspects of a power source generator. For example, the set of power source sensors 240 may include sensors for a solar panel, where the solar panel sensors may provide measurements such as a set of solar irradiation predictions, the current being provided by the solar panel, a solar panel orientation, or the like. Additionally, the power source sensors may provide measurements characterizing the state of an ICE, such as an ICE temperature, an amount of fuel in a tank used to provide fuel to the ICE, a power output relative to a maximum power output, or the like. As described elsewhere in this disclosure, these measurements may be used to predict power outputs or quantities of energy produced by a renewable or non-renewable energy generator.

Some embodiments may permit a user to use a user interface 250 to provide additional data useful for predicting power consumption or power generation values. The user interface 250 may provide different types of UI screens that include different UI elements. For example, the UI screen 251 includes a first UI element 252, which permits a user to directly control the activation of a generator or an operational parameter of the generator via the buttons labeled "1," "2," and "3." The first UI screen 251 also includes a second UI element 253 that enables a user to control a water pump. The first UI screen 251 also includes a second UI element 253 that enables a user to control a water pump or schedule a usage of the water pump. The first UI screen 251 also includes a third UI element 254 that enables a user to control access to different types of networks.

As described elsewhere in this disclosure, one or more UI elements may permit a user to enter a schedule for different equipment of a vehicle, such as a water pump, a generator, or the like. Some embodiments may also limit the usage of one or more components of a vehicle such that a scheduled activation time is permitted when the scheduled activation time is within a permitted generator activation interval. For example, a first scheduled activation time may be within a permitted generator activation interval, and a generator is permitted to be active during the scheduled activation time. A second scheduled activation time may be outside a permitted generator activation interval, where the generator is shut down or prevented from activating during the scheduled activation time. Furthermore, some embodiments may provide a user with an option to schedule a use of one or more components of a vehicle, where the schedule may then be analyzed to determine the power consumption at different times of the day or different times of the year. For example, some embodiments may permit a user to enter a preferred waking time, preferred cooking time, times of absence, and preferred sleeping time. Some embodiments may then use the schedule to determine or update a predicted set of power consumption values for the vehicle during a time interval covering the schedule.

Some embodiments may use the embedded system 260 to collect data from a set of sensors or other types of data sources described above. The embedded system 260 may then execute program instructions to control the operation of a power source controller 242, where the power source controller 242 may be used to activate, deactivate, or otherwise modify the operations of a power source generator. While depicted separately, in some embodiments, the power source controller may be integrated with the embedded system 260 in some embodiments. For example, the embedded system 260 may include a power source controller that includes a microprocessor to control a generator, a terminal(s) to receive wires connected to the generator, a relay to modify incoming or outgoing electrical signals, or the like. Examples of a power source controller may include a GSCM-mini as produced by Atkinson Electronics headquartered in Murray, Utah, or an XIV Auto Generator Start as produced by Schneider Electric headquartered in Rueil-Malmaison, France.

Some embodiments may integrate the embedded system 260 with a set of memory devices storing a set of records 280, where the set of records 280 may include different data repositories such as a first repository 281 for storing sensor data, a second repository 282 for storing energy generation data, or a third repository 283 for storing energy consumption data. Some embodiments may store the values of the set of records 280 using a SQL database. Alternatively, or in addition, some embodiments may store the values of the set of records 280 in a NoSQL database, such as MongoDB, DynamoDB, Redis, or the like.

Some embodiments may further store records corresponding with a weather model usable to determine weather data or other environmental data around a vehicle. For example, some embodiments may store a weather data model, where each record of weather is associated with a set of weather model values such as a time, geolocation, and a set of weather forecast values such as a cloud coverage, dew point, humidity, pressure, visibility, temperature, wind speed, wind orientation, or the like. As described elsewhere in this disclosure, weather changes in the weather forecast may cause updates in predicted power output. Some embodiments may include other environmental data values in a weather data model, such as a sunrise time, sunset time, pollution indicator, amount of shade in a local environment, or the like. Some embodiments may also store records corresponding with sensor data models, generators data models, battery data models, or the like.

Some embodiments may use an analytics system 270 to somebody to perform higher order computations based on data collected by the embedded system 260, where the data may be provided directly by the embedded system 260 or the set of records 280, the external data 220, or another data source. For example, the analytics system 270 may perform a set of machine learning operations to predict an energy consumption rate, a generator power output, a future control parameter for a power source controller 242, or the like. As described elsewhere in this disclosure, the machine learning operations may include one or more machine learning models to generate predictions for power generation or power consumption based on inputs such as a set of weather model values, other environmental data, occupant behavior, a current time, a current time relative to a sunrise time, or the like. As discussed elsewhere in this disclosure, the machine learning models may include support vector machines, random forest, or neural network models.

As described elsewhere in this disclosure, some embodiments may determine that an excess amount of energy will be produced by a renewable energy source that cannot be stored in the batteries of a vehicle. For example, the battery may be unable to store energy at a rate that is greater than a maximum charging rate, or a battery may be unable to store energy that exceeds its maximum power capacity. Some embodiments may transfer this excess energy to one or more scalable computing operations, such as a blockchain-related application. For example, as further described elsewhere in this disclosure, some embodiments may perform cryptocurrency mining using an excess energy generated by a renewable energy generator that cannot be stored by a battery, where cryptocurrency mining may include generating multiple hash values to find a hash value that satisfies a set of criteria, such as generating a hash value that is less than or equal to a target hash.

Figure 3:
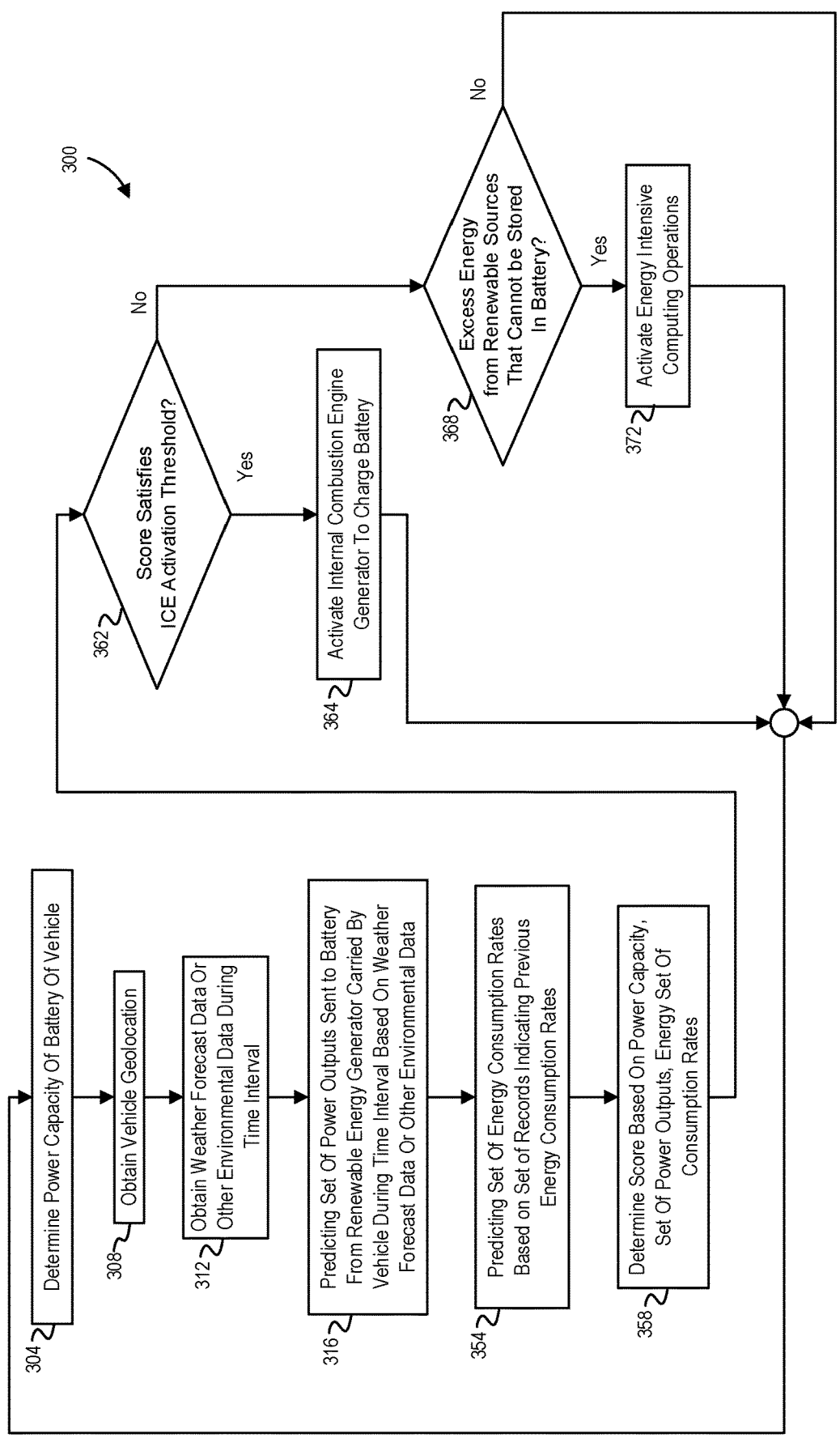
FIG. 3 is a flowchart of a process for activating a non-renewable energy generator, in accordance with some embodiments.

FIG. 3 is a flowchart of a process for activating a non-renewable energy generator, in accordance with some embodiments. FIG. 3 is a flowchart of processes that may be implemented in the computing environments of FIG. 1 to manage a set of battery-coupled generators, in accordance with some embodiments. For example, the process may execute one or more routines in the vehicle system 100. In some embodiments, the various operations of the process 300 may be executed in a different order, operations may be omitted, operations may be replicated, additional operations may be included, some operations may be performed concurrently, some operations may be performed sequentially, and multiple instances of the process 300 may be executed concurrently, none of which is to suggest that any other description herein is limited to the arrangement described. In some embodiments, the operations of the process 300 may be effectuated by executing program code stored in one or more instances of a machine-readable non-transitory medium, which in some cases may include storing different subsets of the instructions on different physical embodiments of the medium and executing those different subsets with different processors, an arrangement that is consistent with use of the singular term "medium" herein.

The process 300 may include determining a power capacity of a battery of a vehicle, as indicated by block 304. As used in this disclosure, a battery may include a single battery device or a collection of battery devices. For example, a battery may refer to a single Li-ion battery cell, or a series of Li-Ion battery cells, multiple Li-ion battery units having multiple battery cells per unit, or the like. Some embodiments may store electric energy in one or more of various types of batteries, such as Li-ion batteries, Li-ion polymer batteries, lithium-metal hydride batteries, or the like.

As described in this disclosure, a vehicle battery may include a battery device that is integrated into the motor system of a vehicle. For example, a battery may include a single battery device of a motor vehicle that provides electrical energy to the motor engine of the motor vehicle and is charged by a renewable or nonrenewable energy source. Alternatively, or in addition, the vehicle may include both a chassis battery to provide energy to a motor engine and a house battery to power additional components of the vehicle, such as a heating and cooling system, a set of water pumps, a set of heating elements, a communication system, electronic appliances, electrical outlets, or the like.

The process 300 may include obtaining a vehicle geolocation, as indicated by block 308. Obtaining the vehicle geolocation may include obtaining the vehicle geolocation from a GPS device, where the GPS device may receive signals from GPS satellites. Alternatively, or in addition, obtaining the vehicle geolocation may include obtaining a location based on an Internet connection with a local wireless network. For example, a determination that the vehicle is at a geolocation may be made based on a determination that a computing device of the vehicle is in wireless communication with a local Wi-Fi network, where the geolocation of the local Wi-Fi network is known. Alternatively, or in addition, obtaining the vehicle geolocation may include obtaining the geolocation from a UI, where a user may directly enter geolocation coordinates into a text box.

Some embodiments may obtain a set of geolocations representing a scheduled path to be traveled by a vehicle, where the scheduled path may include a set of geographic locations that are scheduled to be visited by the vehicle. For example, some embodiments may retrieve a route through a set of roads representing a scheduled path of the vehicle on the set of roads, where the speed of the vehicle and the geographic locations of the route are stored in memory. As discussed elsewhere in this disclosure, some embodiments may use this geolocation data in conjunction with the forecasted set of vehicle velocities to predict future geolocations of the vehicle. For example, for each respective geolocation of the path, the respective geolocation may be associated with a respective solar irradiance value. Similarly, some embodiments may obtain a navigation plan of the vehicle through a body of water or through the air to obtain the geolocations of the vehicle at different time intervals.

The process 300 may include obtaining weather forecast data or other environmental data during a time interval, as indicated by block 312. Some embodiments may obtain a set of measurements from a set of sensors of the vehicle. For example, some embodiments may poll a set of registers to obtain values or receiving interrupts reporting values on a bus, like a CAN bus, where the values may indicate a weather forecast or other environmental data. In addition, some embodiments may obtain signals from a GPS sensor of the vehicle to indicate the location of the vehicle and the corresponding BMS, renewable energy source(s), or other energy generator(s) of the vehicle. As described elsewhere in this disclosure, different subsets of a set of weather model values may be associated with different geolocations or different times. Furthermore, as described elsewhere, some embodiments may determine different power outputs for these different subsets of a set of weather model values. For example, for each respective subset of the set of weather model values indicating decreasing cloud coverage over time, some embodiments may determine a respective power output of the set of power outputs that increases over time based on the respective subset of the set of weather model values associated with a respective duration of the time interval.

Some embodiments may obtain a set of weather forecast values from a set of remote data sources via a network interface, such as a cellular network interface or another wireless network interface, a wired interface, a Wi-Fi interface, or a low-earth-orbit satellite network interface. For example, some embodiments may send a hypertext transfer protocol (HTTP) web request to a server via a weather API, where the web request may include a set of geolocations and a set of times corresponding with a set of geolocations. Some embodiments may then receive an HTTP web response from the server, where the web response may include a set of times indicating sunrise or sunset, a set of weather model values such as a set of cloud coverage or a set of solar irradiance predictions, or the like.

A set of weather-related values may include quantitative values indicating a sun position or other values usable for determining the power output of solar energy sources. For example, some embodiments may obtain a set of environmental data values indicating a position of the sun relative to a solar energy source of the vehicle throughout the day, such as a sunrise time, sunset time, an altitude and azimuth of the sun at 15-minute increments, or the like. Some embodiments may obtain other environment-related values such as quantitative values representing a percentage of solar irradiance predictions, cloud coverage, visibility, or the like. For example, some embodiments may send a web request to a weather-related server that includes the list "[['38.8° N, 77.0° W', 205004010800], ['38.9° N, 77.1° W', 202104200900]]," which may represent a scheduled path of a vehicle traveling from a first geolocation having the GPS coordinates "38.8° N, 77.0° W" at 8 AM on Apr. 1, 2050 to a second geolocation the GPS coordinates "38.9° N, 77.1° W" at 9 AM on Apr. 1, 2050. Some embodiments may then obtain a web response from the weather-related server that includes values to indicate weather forecast values such as a global horizontal irradiance (GHI), direct normal irradiance (DNI), a cloud opacity, or the like. As described elsewhere in this disclosure, weather changes indicated by a weather forecast may cause changes in the power output of a renewable energy generator over a time interval. For example a web response to the web request described above may include the list "[[GHI: 1120, DNI: 1050, cloudOpacity: 0.1], 205004010800], [GHI: 750, DNI: 560, cloudOpacity: 0.5], 202104200900]," where the list indicates that the global horizontal irradiance is 1120 watts per meter squared (W/m2), the direct normal irradiance is 1050 W/m2, and the cloud opacity is 0.1 on 8 AM on Apr. 1, 2050 and that the global horizontal irradiance is 750 watts per meter squared (W/m2), the direct normal irradiance is 560 W/m2, and the cloud opacity is 0.5 on 9 AM on Apr. 1, 2050. Alternatively, or in addition, the set of weather forecast values may also include categorical values representing weather types, such as "rain," "hail," "fog," or the like. Some embodiments may account for these categories with weighting values that may update an anticipated power output of a renewable energy source. As described elsewhere in this disclosure, some embodiments may then predict a power output based on the weather forecast values and equipment-specific parameters of the solar energy source, where operations to predict the power output may include using an analytical or empirical model, using a trained machine learning model, using a statistical model, or the like.

In some embodiments, a set of weather-related values may include weather-related values that are usable for determining the power output of wind turbine generators. For example, some embodiments may obtain wind speeds and wind direction measurements based on a geolocation and a time that the vehicle is present at the geolocation. As described elsewhere in this disclosure, some embodiments may then determine an anticipated power output based on the wind speeds and wind direction measurements. For example, some embodiments may obtain a set of wind turbine parameters associated with a wind turbine for use in a function that includes instructions to determine a power output for a given wind turbine based on a wind speed, a wind direction, and the set of wind turbine parameters corresponding with the given wind turbine.

The process 300 may include predicting a set of power outputs to be sent to the battery from a renewable energy generator carried by the vehicle during the time interval based on the weather forecast data or other environmental data, as indicated by block 316. A power output may be measured in power measurements, such as watts, kilowatts (kW), or the like. As described above, some embodiments may predict the power output of a renewable energy source based on a set of geolocations. For example, some embodiments may determine the power output of a vehicle during a time interval by determining the geolocation of a vehicle, based on the geolocation and determine a set of weather-related parameters based on the geolocation. Some embodiments may then determine the power output of a renewable energy source for the time interval based on the set of weather-related parameters.

Some embodiments may determine a set of power outputs based on equipment-specific parameters of a renewable energy source and the set of weather-related data or other environmental data described above. For example, some embodiments may determine a power output based on a set of equipment-specific parameters and a set of weather-related data. Various operations may be performed to obtain a set of equipment-specific parameters. For example, a set of solar panel parameters may be provided by software, retrieved from a database of parameters stored on a local computer memory of the vehicle, obtained via a wireless signal, or manually entered by a user via a UI. The set of solar panel parameters be used by a solar power model to determine an amount of power produced by a solar energy generator. In some embodiments, the solar power model may be linear model, where a predicted solar irradiance is proportional to a power output. The set of solar panel parameters may include a scaling factor used to determine a power output from a computed solar irradiance prediction. For example, some embodiments may obtain a solar irradiance predictions of a 1000 W per meter^2 ($W/m^2$) from a weather forecast and obtain a scaling factor of 0.20 as part of the set of equipment-specific parameters. Based on a user-entered value that the solar panels of the solar energy generator have a total surface area of 10 $m^2$, some embodiments may determine that the power output during the duration is equal to 2000 W based on the product of 1000 $W/m^2$, 10 $m^2$, and 0.2.

Some embodiments may also query a weather API for wind direction and wind speed predictions corresponding with times bins associating different times (e.g., durations) during the time interval for which predictions are being made. Additionally, some embodiments may use the wind-related data to predict wind turbine power outputs using an analytical or semi-analytical method. For example, some embodiments may determine a power output using a cubic approximation, where the power output of a wind turbine is approximated to scale cubically with the wind speed. Some embodiments may account for the velocity of the vehicle when computing wind speed. For example, some embodiments may determine a shared vector component between a ship velocity on a body of water and the velocity of the wind. Some embodiments may determine the shared vector component by performing a dot product multiplication between a first vector representing a ship velocity and a second vector representing a wind velocity. Some embodiments may then predict a power output by determining a cube of the absolute value of the shared vector component and then determine the power output by multiplying by a scaling factor. Operations to accurately predict wind turbine power outputs while a vehicle is in motion may be advantageous for watercraft, which may often be in motion while the wind turbine of the watercraft is generating power.

Some embodiments may use a set of records indicating previous power outputs of a generator to predict future power outputs of the generator. For example, some embodiments may store a set of values associating power output from a power source with a set of weather forecast values and determine a set of power outputs based on the stored set of values. Various operations may be performed to determine the parameters of a power-output-predicting function, such as by using regression-based operations, statistical operations, or machine learning operations. Some embodiments may directly use a power output of the set of records to predict a future power output without transforming the recorded power output. For example, some embodiments may determine that a GPS location of a later day is within a range threshold of a previous GPS location of a previous day and, in response, query a record of power output(s) of a renewable energy source to use the recorded power output(s) from the previous day as a prediction of the power output for the later day.

Some embodiments may account for other factors when predicting a set of power outputs, such as shade or smoke. For example, some embodiments may predict a quantitative effect that shade from a nearby structure has on a vehicle's solar panels and determine an hour-by-hour (or some other shared time bin) based adjustment to predict the power output of the solar panels. For example, some embodiments may apply a power generation model based on a geolocation that first predicts a power output over a time interval using based on environmental data obtained from a weather API and then updates the power output based on an indication that the geolocation is associated with the indicator "shade."

Some embodiments may use operations based on time series analysis or related methods to predict a set of power outputs. For example, some embodiments may predict a power output using time series analysis of power outputs at previous times, locations, or environmental data to predict future power output based on future times, locations, or environmental data. Some embodiments may apply one or more transformation operation on input data to predict future outputs, where transform operations based on cyclical patterns may provide increased predictive accuracy. For example, some embodiments may apply Fourier analysis on a set of records indicating previous power outputs of a generator to determine frequency components. Some embodiments may then store frequency components that exceed a threshold and use the stored frequency components to predict power outputs based for the generator on a geolocation, time, environmental data. For example, some embodiments may apply and scale a set of stored frequency components in the time-domain with a phase shift to predict power outputs based a geolocation and time of year.

Some embodiments may use other statistical or machine-learning models to determine power outputs (or inputs, or when to engage the ICE for power generation in an end-to-end model), such as a hidden Markov model (or other dynamic Bayesian network) to determine a power output of a renewable energy generator such a wind turbine or a solar panel. For example, some embodiments may use a hidden Markov model to predict a power output or a weighting value used to affect a power output based on a set of categorical weather values, such as 'hailing', 'icy road', or 'inside city,' where the predicted power output may be multiplied by the weighting value to predict an updated power output. Using the hidden Markov model may include using a set of numerical or categorical values, such as a current solar irradiance value or cloud coverage percentage, as observations of a state, and predict a future state based on the previous state(s). The hidden Markov model may quantify these states and apply a hidden transformation state, which may be represented as an array or matrix, to the hidden Markov model to predict a future state. The observations of the future may then be used to predict a future power output or other prediction, such as a future power consumption. By using a hidden Markov model or other statistical model, some embodiments may account for categorical information stored in weather data or other environmental data to increase the accuracy of a power output prediction. Furthermore, some embodiments may use simulations or statistical models to generate a range of power outputs for a generator for one or more times of a time interval. For example, some may use Markov chain model or a set of Monte Carlo simulations to generated different environmental states weighted by their probabilities of occurrence to generate sets of different predicted power outputs and their associated likelihood values. Other example approaches include use of a reinforcement learning model in which a model policy or state value function is learned by adjusting weights and biases in a deep neural network.

As described elsewhere in this disclosure, the predicted power outputs, predicted quantity of consumed energy, or other predicted value may be one of a set of predicted values. For example, some embodiments may use a statistical model to predict an uncertainty or confidence intervals for one or more predicted value, such as ranges of consumption and renewable production. By varying the environmental data associated with a geolocation over time, some embodiments may generate a time-varying curve representing power output over time. Furthermore, by accounting for uncertainty in the weather conditions or other environmental conditions associated with a location, some embodiments may generate uncertainty bands representing confidence intervals for a power output over time. For example, some embodiments may compute a range in which a power output is expected to fall with 95% confidence band over 15-minute increments for the next 12 hours and represent the range with different sets of power generation values. For example, some embodiments may generate two sets of power outputs, where the first set of power outputs may represent an upper end of a confidence band and the second set of power outputs may represent a lower end of the confidence band.

Some embodiments may update a set of predicted energy outputs based on a user setting a risk tolerance that adjusts the value(s) for predicted energy outputs. For example, some embodiments may update the set of predicted energy outputs based on a prediction parameter indicating that power output predictions should be conservatively set at the $25^{th}$ percentile, which may reduce a predicted set of power outputs corresponding with each hour of a 3-hour period from ["1000 W", "500 W", "1000 W"] to ["900 W", "450 W", and "900 W"]. As described elsewhere in this disclosure, some embodiments may use different sets of predicted power outputs to schedule generator activation with different degrees of probability or indications of risk.

Some embodiments may use machine learning operations to determine a power output based on geolocations. For example, some embodiments may use recurrent neural networks (RNNs), like a long-short term memory (LSTM) models trained on a historical set of records that include power outputs. Using a LSTM may include using a RNN having neurons storing a first set of model parameters that are retained over longer period of time than a second set of model parameters, where both the first and second set of model parameters may be updated based on inputs to the neurons. For example, a BMS may use a machine learning model such as a supervised learning model, an unsupervised learning model, a semi-supervised learning model, a reinforcement learning model, or the like. The machine learning model may include a neural network trained to determine a power output value. The neural network may be based on a large collection of nodes. Each node of a neural network may be connected with many other nodes of the neural network. Such connections can be enforcing or inhibitory in their effect on an activation state of one or more connected nodes. In some embodiments, each individual node may use a summing function that combines the values of its inputs together, where an input may be a weather-related value or other value, a geolocation, a time of day, a sensor reading from a sensor of the vehicle, a water current, a computed result based on any of the above, or the like. In some embodiments, each connection (or the node itself) may use a threshold function such that an input signal must surpass the threshold before the node propagates the signal to other nodes. A neural network system may be self-learning and trained, rather than explicitly programmed, and can perform significantly better in certain areas of problem-solving compared to other computer programs. In some embodiments, neural networks may include multiple layers (e.g., where a value traverses from front layers to back layers). In some embodiments, back-propagation techniques may be utilized by the neural networks, where forward stimulation is used to reset weights on the "front" nodes. In some embodiments, stimulation and inhibition for neural networks may be more free-flowing, with connections interacting in a more chaotic and complex fashion.

The neural network may include one or more types of neural network, such as a feedforward neural network, radial basis function neural network, self-organizing neural network, convolutional neural network, a RNN, modular neural network, transformer model, some combination thereof, or the like. For example, some embodiments may use a trained feedforward neural network to predict a power output such as 1100 W based on a geolocation and a time of day. By using a neural network to predict a power output, some embodiments may be able to account for equipment variation or un-modeled environmental factors. Alternatively, or in addition, some embodiments may use a transformer model to predict a power output of a generator, a power consumption, or another value described in this disclosure. Using the transformer model may include using an encoder neural network and a decoder neural network. The encoder neural network of the transformer model may include a multi-head attention model for performing self-attention operations to assign attention values to different input parameters, such as weather forecast values, sensor measurements, or the like. the decoder neural network of the transformer model may include a masked multi-head attention model that uses the attention values to generate predictions of power outputs, power consumption, or the like. Furthermore, while the above discloses an embodiment that provides advantages based on the use of a neural network or another learning system, not all embodiments necessarily provide the advantage or necessarily include a neural network or other learning system, and some embodiments may lack the above-described advantages in view of trade-offs or other advantages.

The process 300 may include predicting a set of power consumption values based on a set of records indicating previous power consumption values by the vehicle, as indicated by block 354. Some embodiments may predict a rate that energy will be consumed from a battery based on a user-entered amount that are then stored in a set of records indicating previous power consumption values by components of the vehicle. For example, some embodiments may cause the display of a UI having UI elements that permit a user to configure user-related lifestyle attributes or other attributes usable to predict electricity consumption. A web application or native application may be coupled, via the Internet and a webserver, to a network interface of a BMS of a vehicle. A user may then configure one or more attributes by manipulating one or more UI elements of the web application or native application to indicate values such as a preferred clock time of waking up, clock time for sleeping, preferred temperature ranges, preferred humidity values, preferred windows of time to use specific electricity-consuming devices such as a water pump, air conditioning device, heating device such as a stove or a microwave, or the like. Some embodiments may then adjust a predicted power consumption based on these attributes or the set of durations indicated by these attributes. For example, some embodiments may increase an power consumption for the set of clock times between 2 PM to 3 PM of a time interval set as being the time between 1 PM to 5 PM, where the set of clock times from 2 PM to 3 PM are indicated by a user as being moments of increased activity.

Some embodiments may associate different sets of devices with different device schedules, where the device schedule may indicate different sets of durations for each set of devices that may then be used to determine individual increases in an energy consumption rate. For example, a user may indicate that a set of devices connected to a electrical outlets of the vehicle include a set of air conditioning devices, a set of heating devices, and a set of water pumps. Each set of devices may be associated with different activities and may be scheduled to occur over different sets of durations, which may then result in different sets of increased power consumption values over a time interval. For example, a set of air conditioning devices may be scheduled to be active over a first set of durations of the time interval, such as during the time between 1 PM to 2 PM and 6 PM to 8 PM. Similarly, a set of heating devices may be scheduled to be active over a second set of durations of the time interval, such as during the time between 1 PM to 1:30 PM and 6 PM to 7 PM. Similarly, a set of water pumps may be scheduled to be active over a third set of durations of the time interval, such as during the time between 4 PM to 5 PM. Some embodiments may then retrieve a set of equipment parameters storing an air conditioning power use estimate, a heating device power use estimate, and a water pump power use estimate. Some embodiments may then increase the power consumption for the times between 1 PM to 2 PM and 6 PM to 8 PM based on the air conditioning power use estimate, increase the power consumption for the times between 1 PM to 1:30 PM and 6 PM to 7 PM based on the heating device power use estimate, and increase the power consumption for the time between 4 PM to 5 PM based on the water pump power use estimate.

Some embodiments may use a set of clock times provided by a user to determine a schedule of equipment use. For example, a user may update a schedule to indicate that a water pump will be active between 9 AM and 10 AM every morning. Some embodiments may then update a predicted power consumption by retrieving a stored parameter corresponding with the power consumption of the water pump and increase the electricity consumption by an amount indicated by the stored parameter. Alternatively, or in addition, some embodiments may shift an power consumption used to predict an power consumption over a time interval based on a user's preferred wake-up time, sleeping time, or based on an indication to shift a schedule of activity based on a sunrise time or sunset time.

Some embodiments may predict energy consumption quantities based on a set of sensor measurements of a set of sensors that are stored in a set of records indicating previous power consumption values. The set of sensor measurements may include whole-vehicle power consumption measurements, power consumption of an electrical outlet or set of electrical outlets, power consumption values associated with different activities or sections of a vehicle, or the like. Some embodiments may predict energy consumption quantities by determining one or more measures of central tendency (e.g., a mean average, a median, a mode) of past power consumption values for different clock times of a time interval. For example, some embodiments may collect the previous ten power consumption values for a vehicle at 10 AM for the previous ten days, compute a mean average value of the ten values, and use the mean average value as a prediction for the power consumption of the eleventh day.

Some embodiments may predict power consumption values based on values that determined from both a user-indicated preference and one or more environmental parameters. For example, some embodiments may receive a set of user-indicated preferred temperatures and predict a power consumption based on the user-indicated preferred temperature and an external temperature of the vehicle. Some embodiments may use an analytical, semi-analytical or empirically-derived function to determine a contribution to a power consumption based on a temperature difference or another difference between a user's indicated state and an environmental parameter. Such differences may include a difference between a preferred humidity and an external humidity, a preferred pressure and an external pressure, or the like.

Some embodiments may use a machine learning model and configure a set of model parameters for predicting energy consumption quantities based on one or more user-provided values, stored sensor values or results computed from user-provided values or sensor values. For example, some embodiments may obtain a set of sensor measurements from a set of sensors, where the sensor measurements may include a temperature measurement, a pressure measurement, a humidity measurement, or the like. Some embodiments may then determine a set of power consumption values based on the set of sensor measurements using a machine learning model such as an LSTM or another type of RNN. Neurons of a RNN may include a set of hidden state values and may be structured such that prior inputs of a RNN may be represented in a hidden state of a new input. By using a RNN, some embodiments may be trained to detect correlations between previous patterns of power consumption values and sensor measurements over time. For example, by using a RNN, some embodiments may predict the time of an increase in an power consumption after a sensor-detected increase in a vehicle temperature. Furthermore, some embodiments may use other sources of data as inputs for machine learning model to predict an energy consumption rate. For example, some embodiments may query a calendar API to determine a time of year and query a third-party server to obtain a sunrise time, sundown time, and set of weather-related data based on a geolocation. Some embodiments may then use the obtained values as inputs for a machine learning model to obtain a predicted energy consumption rate.

Some embodiments may configure a set of model parameters for a RNN by training the RNN based on a set of records indicating previous energy rates and a set of records indicating previous set of sensor measurements. For example, as stated elsewhere in this disclosure, some embodiments may be configured to upload sensor measurements or other data from a local memory to a remote server or data storage service. Some embodiments may then access the remote server or data storage service and use one or more remote computing services to train a RNN or other machine learning model by configuring a set of model parameters of the RNN or other machine learning model. Some embodiments may then retrieve the set of model parameters after training and store the set of model parameters in a local memory of the vehicle, which may reduce the need for the vehicle to perform computationally costly training operations. Furthermore, some embodiments may delete a version of the set of sensor measurements stored in local memory upon receiving a confirmation message that the set of sensor measurements were successfully uploaded to the remote server or data storage service. By deleting the local version of the set of measurements, some embodiments may free data storage space for future sensor measurements.

Some embodiments may use a set of sensor measurements of a vehicle to detect or identify vehicle occupants and use a count of the occupants or the identity of the occupants to predict a set of energy consumption rate. For example, some embodiments may detect the presence or absence of a user based on a set of sensors of a vehicle (e.g., temperature sensor, weight sensors, motion sensors, sound sensors) or a wearable computing device attached to the user. Some embodiments may increase a predicted power consumption based on a count of the number of occupants of a vehicle, where the increase may be based on a multiplier factor or a set of rules. For example, some embodiments may determine that a set of occupants of a vehicle includes two occupants instead of one occupant and increase a predicted power consumption by 75% or some other percentage. Alternatively, or in addition, a BMS may predict different power consumption values for different vehicle occupants based on their corresponding occupant records. For example, some embodiments may identify an occupant as an identified occupant. Some embodiments may then retrieve an occupant record from a set of occupant records and then learn the identified occupant's schedule of device usage from the occupant record. The occupant record may indicate different activity at different clock times, different durations, at times relative a local sunrise time or sundown time, or the like. Some embodiments may use a default set of parameters to predict power consumption values and switch to a set of occupant-specific parameters stored in a corresponding occupant record that is learned or provided by a user after a threshold amount of data is recorded for generating the set of user-specific parameters.

Similar to the prediction of power outputs, some embodiments may use statistical models to determine power consumption values. For example, some embodiments may use a markov chain model, such as a hidden Markov model, to predict different sets of power consumption values for different scenarios, weighted by their probabilities of occurrence. As described elsewhere, inputs to a hidden Markov model or other statistical model to may include sensor measurements, previous electric device usage data stored in records, user-indicated schedules of behavior, or the like. Each set of the different sets of power consumption values may be associated with a time of the same time interval. In some embodiments, the multiple power consumption values corresponding with a single time of the same time interval or binned into a shared time bin may be used to establish confidence intervals for a predicted set of power consumption values. For example, some embodiments may generate two sets of power consumption values, where the first set of power consumption values may represent an upper end of a confidence band and the second set of power consumption values may represent a lower end of the confidence band.

Similar to the predictions of power outputs, the use statistical methods or simulations may result in the generation of multiple sets of power consumption values. For example, some embodiments may generate different sequences of user behavior indicating electrical energy, where the probabilities associated with the different sequences may be based on a geolocation of the vehicle and the previous behaviors of a vehicle occupant. Some embodiments may then generate a time-varying curve representing power consumption over time. By accounting for uncertainty in the power consumption for a future time interval based on a location and a vehicle occupant's previous behavior, some embodiments may generate uncertainty bands representing confidence intervals for a power consumption over time.

As described elsewhere in this disclosure, some embodiments may account for uncertainty when performing one or more the operations described in this disclosure. For example, some embodiments use a statistical model or stochastic simulations to predicting multiple sets of power consumption values, such as more than 10 sets of power consumption values, more than 100 sets of power consumption values, or more than 1000 sets of power consumption values, where each set shares a same time interval. Some embodiments may use previous power consumption values associated with a geolocation to provide parameters the statistical model. Some embodiments may then determine a set of power consumption expectation values and uncertainty bands surrounding the set of power consumption expectation values. In some embodiments, the boundaries of the upper band and the lower band may be set based on an upper band threshold and a lower band threshold. In some embodiments, the upper band threshold may be a value greater than 0.5 and a lower band threshold may be a value less than 0.5, where both thresholds may be bound between 0 and 1.0, or percentile/ratio formats thereof. For example, some embodiments may use an upper band threshold equal to 80% and a lower band threshold equal to 20%. Some embodiments may then determine a lower band power consumption curve by, for each respective time of a set of times of a time interval, determining a lower band value by selecting a power consumption value equal to or closest to the lower band threshold. For example, if the lower band threshold is 20%, some embodiments may select power consumption value closest to the $20^{th}$ percentile for that respective time of the time interval (i.e., 20% of power consumption values are lower than the lower band value at that respective time). Similarly, some embodiments may determine an upper band power consumption curve by, for each respective time of the set of times, determining an upper band value by selecting a power consumption value equal to or closest to the upper band threshold. For example, if the upper band threshold is 80%, some embodiments may select a power consumption value closest to $80^{th}$ percentile for that respective time of the time interval (i.e., 80% of power consumption values are lower than the upper band value at that respective time). As described elsewhere in this disclosure, in this disclosure, some embodiments may then calculate multiple scores based on the upper and lower band power consumption curves.

The process 300 may include determining a score based on the power capacity, the set of power outputs, and a set of power consumption values, as indicated by block 358. As described elsewhere in this disclosure, the score may be used to determine whether to activate a generator based on a set of power outputs and power consumption values. Different types or orders of operations may be performed to determine a score. Some embodiments may determine a set of rate differences between an power consumption and a power output rate of a renewable energy generator and then integrate the rate difference to predict an energy deficit that is used as a score or used to determine a score. Alternatively, or in addition, some embodiments may determine quantities of energy for each generator and for energy consumption and then determine a score based on the computed energy values.

As described above, some embodiments may determine a set of differences between a set of power outputs and a set of power consumption values and then integrate the set of differences over a time interval to predict a net energy change to a battery. For example, some embodiments may predict a set of power outputs and store the set of power outputs in a list as [1000, 500, 700], where each number represents a power output in kilowatt-hour per hour (kWh/hr) and is associated with a one-hour duration of a three-hour time interval. Some embodiments may predict a set of power consumption values for the same time period and store them in a list as [500, 550, 900] for the same time interval, where each number represents an power consumption in kWh/hr. Some embodiments may then determine a set of differences between the set of power outputs and the set of power consumption values and store the set of differences in a list as [500, −50, −200], where each value represents a power in kWh/hr. Some embodiments may then numerically integrate the energy difference rate as defined by the set of differences over the three-hour time interval to determine a net energy difference of 250 kWh. Some embodiments may then add this net energy difference to a power capacity of a battery to determine a score representing the total amount of energy stored in the battery at the conclusion of the time interval.

As described above, some embodiments may independently determine energy values for each generator or type of generator (e.g., renewable generators vs. non-renewable generators). For example, to determine a score corresponding with a 3-hour time interval, some embodiments may integrate a predicted set of power outputs of a renewable energy generator to predict a total quantity of energy being produced by the renewable energy generator. Similarly, some embodiments may integrate the predicted set of power consumption values of a vehicle to determine a total quantity of energy consumed during the time interval. Some embodiments may then determine a score as the difference between the total quantity of energy produced and the total quantity of energy consumed. Alternatively, or in addition, some embodiments may determine a score as sum of the difference and a power capacity of a battery.

In addition to using a set of predicted power outputs of a renewable energy generator to determine a score, some embodiments may use a set of predicted power outputs of a non-renewable energy generator to determine a score. For example, some embodiments may combine the power outputs from both renewable and non-renewable energy generators and determine a difference with a rate of energy consumed for a time interval to determine a total predicted energy change and use the total predicted energy change as a score. Some embodiments may predict the power output of an ICE generator using a set of generator parameters associated with the ICE. For example, some embodiments may retrieve a set of ICE parameters from a record of equipment parameters to predict a power output of the ICE generator and predict the amount of energy to be produced by the ICE generator over the time interval. Alternatively, or in addition, some embodiments may use records of past power outputs from the ICE generator to predict a future power output. For example, some embodiments may determine a power output from an ICE generator by computing an average power output of the generator based on previously-recorded power outputs of the ICE generator.

Some embodiments may determine that a predicted power output exceeds a power output threshold. For example, some embodiments may determine that a set of batteries may have a maximum charging rate and use the maximum charging rate as a power output threshold. Some embodiments may then limit a predicted energy surplus or predicted energy deficit based on the maximum power output. For example, some embodiments may determine that a battery cannot be charged at a rate greater than 1000 Watts even if a power output of a solar energy generator is 1500 Watts. Some embodiments may then cap the power output of the solar energy generator to 1000 watts for the purposes of determining a power deficit or power surplus during a time interval. Some embodiments may model temperature increases in a battery. For example, some embodiments may obtain a battery temperature measurement that indicates an internal or surface temperature of a battery and model changes in the battery temperature while the battery is being charged. Some embodiments may then determine a predicted temperature increase based on the charging of the battery. Some embodiments may determine whether a predicted temperature increase causes the predicted temperature of the battery to satisfy a battery temperature threshold and, in response to a determination that the predicted temperature will satisfy the battery temperature threshold, schedule or otherwise determine a set of charging delays for the battery temperature threshold. Some embodiments may then update a predicted set of power outputs by decreasing the predicted set of power outputs based on the scheduled set of charging delays.

Some embodiments may account for measures of uncertainty when determining a score. Some embodiments may account for a lower percentile estimate when using predicted power outputs and higher percentile estimates when using predicted power consumption. For example, some embodiments may use a set of power consumption values that are above the $75^{th}$ percentile of the greatest power consumption values for a time interval and a power output of a generator that is below the $25^{th}$ percentile of the least power outputs for the same time interval. Alternatively, or in addition, some embodiments may compute multiple scores corresponding with different sets of power consumption values or different sets of power outputs. For example, some embodiments may compute an upper band score based on an upper band power consumption curve and a lower band score based on a lower band power consumption curve. As described elsewhere in this disclosure, some embodiments may determine that the score satisfies a threshold if at least one of the upper band score or lower band score satisfies the threshold. Alternatively, or in addition, some embodiments may generate a distribution of scores corresponding with different probabilities. For example, some embodiments may use perform a set of Monte Carlo simulations to determine a set of scores or determine a distribution of scores using a Gaussian (or other) distribution that is scaled and centered according to the predictions for energy consumption and renewable energy production. As described elsewhere in this disclosure, some embodiments may then determine whether more than a threshold amount of randomized samplings representing scores satisfy a threshold, as further described below.

The process 300 may include determining whether score satisfies an ICE activation threshold, as indicated by block 362. As described elsewhere in this disclosure, the score may be used to determine whether or not to activate a generator based on whether or not the score satisfies a threshold. In some embodiments, the threshold may be a constant value or a pre-determined value. For example, a score may be equal to the sum of a power capacity of a battery and a predicted net energy difference between the energy provided to a battery by a renewable energy generator during a time interval and the predicted energy consumed during the same time interval. Some embodiments may then determine that the score is greater than a threshold, where the threshold may be an absolute amount such as 2.0 kWh or a relative value such as 15% of the maximum power capacity of the battery. Alternatively, the threshold may be a varying value that changes based on a user-defined schedule, a geolocation, or a system-updated value. For example, some embodiments may include instructions to set the threshold to 30% within a first geographic region indicated as rural and set the threshold to 10% within a second geographic region indicated as urban. Furthermore, as described elsewhere in this disclosure, some embodiments may generate multiple scores associated with different probability values or uncertainty bands. Some embodiments may determine that an ICE activation threshold is satisfied if one or more of the multiple scores satisfy the ICE activation threshold.

Different embodiments may make different comparisons to determine that a score satisfies an ICE activation threshold. For example, as described elsewhere in this disclosure, some embodiments may determine that the score satisfies the ICE activation threshold if the score is less than the threshold. Alternatively, some embodiments may determine that a score satisfies the ICE activation threshold if the score is greater than the ICE activation threshold. It should be understood that the different embodiments may then activate an ICE in response to the score satisfying the ICE activation threshold.

As described elsewhere in this disclosure, some embodiments may update an ICE activation threshold or another threshold associated with a battery capacity based on a measurement of battery degradation. For example, some embodiments may measure the maximum power capacity of battery and determine that the maximum power capacity is less than a previous maximum power capacity. Some embodiments may predict degradation based on a cycle count of the battery, where a cycle may be detected as a change in a battery's power capacity within a duration threshold. Alternatively, a cycle count may be determined based a net change in the charge and discharge of a battery. For example, the cycle count of a battery that begins at 100% power capacity and is then discharged from to 50% power capacity before being charged back to a 100% power capacity twice may be increased by one cycle. Based on a determination that a battery has experienced a threshold number of cycle counts, some embodiments may update an ICE activation threshold or a target power capacity of a battery.

In some embodiments, a determination that a score satisfies the threshold may cause a BMS to activate an ICE generator immediately. Alternatively, or in addition, a determination that the score satisfies the threshold may cause a BMS to schedule the activation of the ICE generator. Furthermore, as described elsewhere in this disclosure, some embodiments may schedule a shutdown of the ICE generator after a threshold power is reached. In response to a determination that the score satisfies the threshold, operations of the process 300 may proceed to operations described for block 364. Otherwise, operations of the process 300 may proceed to operations may proceed to operations described for block 368.

In some embodiments, the process 300 includes activating an internal combustion engine generator to charge the battery, as indicated by block 364. As described elsewhere in this disclosure, some embodiments may execute a control routine to charge a battery using a generator, such as an ICE generator. In some embodiments, a BMS may send a set of control signals to one or more non-renewable power generators such as an ICE generator to begin charging a battery. For example, some embodiments may send control signals via a CAN bus to an ICE-coupled generator, an inverter, or an electronically controlled switch used to control whether a non-renewable energy source is allowed to provide energy to a battery. In some embodiments, the set of control routines may be further configured to receive signals indicative of performance of the battery and the power sources. For example, some embodiments may poll registers or receive interrupts via the CAN bus to obtain a set of signals used to determine a state of the battery such as a temperature, a current, a voltage, a power capacity, or the like.

Some embodiments may request a user confirmation before activating a generator. For example, some embodiments may send a notification message to a mobile computing device of a user or a display panel of a vehicle, where the notification message may display a recommendation to activate an ICE generator to charge a battery. Some embodiments may then wait to receive a response message providing user confirmation to activate the generator before activating the generator. For example, some embodiments may send a message scheduling a generator activation at 5 PM, where the generator is not activated at 5 PM unless a user confirms the message.

Some embodiments may use a variable-rate engine to control the amount of electrical energy produced by an ICE. Various operational parameters may be used to control the operation of a generator. For example, some embodiments may use an engine capable of being shifted from a 50 kW to a 100 kW mode of operation. Some embodiments may then use one or more operations described in this disclosure to determine a predicted power deficit and operate the ICE such that a minimum power capacity is satisfied. For example, some embodiments may determine that, for a first hour, a battery will experience an energy deficit of 100 kWh in a first hour and an energy deficit of 200 kWh in a second hour. In response, some embodiments may operate an electricity-producing ICE to produce 100 kWh and 200 kWh for the first and second hours, respectively.

Some embodiments may use one or more machine learning operations to control an engine. For example, some embodiments may train a reinforcement learning model to select and control power sources charging the battery to satisfy one or more thresholds. Various reward functions may be used when implementing a reinforcement learning operation, such as by using a weighted combination of carbon emissions and a risk of under-provisioning power as features in a reward function. For example, some embodiments may train a reinforcement learning model to set control parameters of a generator keep a battery at 80% charge by executing multiple simulations of vehicle operations, where the learning model includes a reward function that rewards model parameter configurations which keep the battery at 80% charge. Some embodiments may use the reinforcement learning model parameters to then set one or more actual operational parameters of a generator.

Some embodiments may employ process control operations to determine when to activate an ICE, where process control operations may include proportional-integral-derivative (PID) operations or model predictive control (MPC) operations. Some embodiments may implement MPC operations to control ICE activation by defining a state as including the battery capacity of a battery as a first state value and a charging rate of the battery as a second state value. Some embodiments implementing the set of MPC operations may further model the power output of a renewable generator as a first actuation input, model the power consumption of the devices of the vehicle as a second actuation input, and model the ICE power output as a third actuation input, where each actuation input is indicated to update at least one of the state values in a linear relationship. Some embodiments implementing the set of MPC operations may further set an error function to be based on a difference between the battery capacity and a target battery capacity, which may be the same or different from the minimum power capacity described elsewhere in this disclosure. Some embodiments may then apply a set of constraints, such as a first constraint that indicates a duration of time in a time interval where the ICE is not permitted to be active, a second constraint indicating a minimum power output of the ICE, or a third constraint indicating a maximum charging rate of a battery. After setting up a linear system using the MPC framework, some embodiments may implement one or more numerical methods to solve the linear system to determine a when to activate an ICE or at what power output the ICE should be set to for ICEs that can be configured to vary their power outputs. For example, some embodiments may implement a gradient descent method to schedule an ICE activation time or determine an operational parameter of the ICE.

The process 300 may include determining whether an excess amount of energy that cannot be stored in the battery is being produced by the set of renewable energy generators, as indicated by block 368. Some embodiments may determine that an excess amount of energy that cannot be stored in a battery system is being produced if a power capacity of the battery has already reached its maximum energy storage capacity while a renewable energy generator is producing electrical energy. In response to a determination that an excess amount of energy of energy that cannot be stored in a battery system is being produced by a set of renewable energy generators, operations of the process 300 may proceed to operations described for block 372. Otherwise, operations of the process 300 may return to operations described for block 304.

In some embodiments, the process 300 includes activating energy-intensive computing operations, as indicated by block 372. Some embodiments may activate energy-intensive computing operations by loading an application state and executing one or more application operations based on the application state. Energy-intensive computing operations may be scalable and may include providing computing services to client computing devices, performing graphic-intensive computing, performing cryptographic operations, or the like.

In some embodiments, the energy-intensive computing operations may include performing program instructions such as performing cryptographic mining computations. For example, some embodiments may increase an amount of electrical power provided to a first computing node of a vehicle, where the first computing node is part of a peer-to-peer computing nodes. The peer-to-peer computing nodes may be used to store a blockchain or another directed acyclic graphs with hash pointers implementing tamper-evident distributed ledger, where a blockchain may include a linked list of blocks. Each respective block includes a Merkel tree and a corresponding Merkel root which provides node attribute of the respective block, and subsequent blocks of the respective block have node attributes that include cryptographic hashes based on the Merkel root of their respective proceeding blocks.

Some embodiments may perform operations to add a new block to the blockchain, such as by performing operations associated with a proof-of-work blockchain mining model. For example, some embodiments may execute program instruction to obtain a target hash of a blockchain stored on the peer-to-peer computing nodes and generate a plurality of hash values. Some embodiments may generate a hash value by randomly or pseudo-randomly generating a nonce value and then performing a series of hashing operations to transform the nonce value to the hash value. Some embodiments may determine whether any of the hash values satisfy a set of criteria based on the most recent block of a blockchain, such as finding a hash value that is equal to or less than the target hash. In response to a determination that the hashed value satisfies the set of criteria, some embodiments may add a new block to the blockchain and send a notification to other nodes of the peer-to-peer computing nodes indicating that the set of criteria has been satisfied and that a new block has been added.

Figure 4:
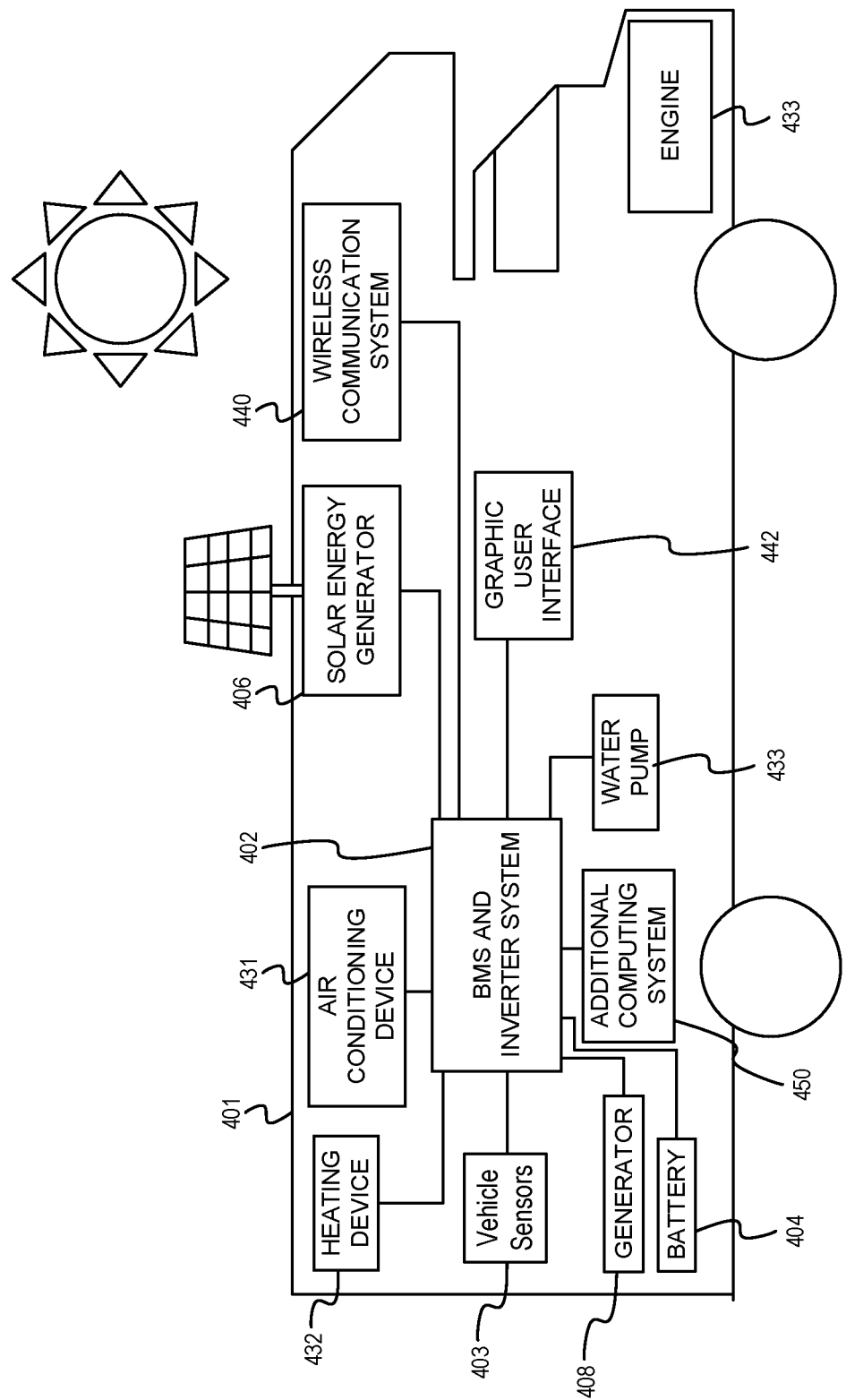
FIG. 4 is a schematic diagram of a vehicle that includes a battery management system, in accordance with some embodiments.

FIG. 4 is a schematic diagram of a vehicle that includes a battery management system, in accordance with some embodiments. The system 400 includes a vehicle 401, which may be an RV or other motor vehicle, where the vehicle 401 is powered by the engine 490. The system 400 may carry a BMS and inverter system 402 to perform one or more operations described in this disclosure. The BMS and inverter system 403 may receive sensor data from the vehicle sensors 402, which may include motion sensors, temperature sensors, pressure sensors, a GPS, or the like. The BMS and inverter system 402 may also receive data from the wireless communication system 440, which may send wireless signals to and receive wireless signals from a server that provides weather forecast data or other environmental data to the BMS and inverter system 402. The BMS and inverter system 402 may also receive schedule data provided by a user, as described elsewhere in this disclosure. The BMS and inverter system 402 may also receive data from a solar energy generator 406, an ICE generator 408, and a battery 404, each of which may be carried by the vehicle 401. Based on the input data and a set of thresholds, the BMS and inverter system 402 or the additional computing system 450 may generate power output predictions for the solar energy generator 406 and further predict power consumption by devices of the vehicle 401. As described elsewhere in this disclosure, the power consumption predictions may include predictions for the power or energy consumed by devices such as the air conditioning device 431, the heating device 432, or the water pump 433.

Based on these predictions, the BMS and inverter system 402 or a computing device controlling the BMS and inverter system 402 may determine that a predicted battery state of the battery 404 satisfies an ICE activation threshold. In response, the BMS and inverter system 402 may activate the ICE generator 408. Some embodiments may further display notifications of predicted states or ICE generator activation on a graphic user interface 442 being displayed in the vehicle 401. As shown in this diagram, the battery 404 may be isolated from the engine 490, which may have its own battery system. Thus, the battery 404 may provide power to the vehicle 401 or be charged by the solar energy generator 406 even when the vehicle 401 is stationary or when the engine 490 is turned off. Furthermore, though the vehicle 401 may be an RV, it should be understood that some embodiments may include a different type of vehicle instead of the RV 401, such as a yacht or other watercraft. Additionally, it should be understood that, in some embodiments, a vehicle does not include one or more power-consuming devices described in this disclosure, which is not to suggest that other parts cannot also be omitted. For example, some embodiments may include a vehicle carrying a renewable energy generator and a non-renewable energy generator that does not include a heating device.

In some embodiments, the vehicle 401 may be used as a public or private transportation vehicle for periods of time greater than one hour, greater than four hours, or greater than 12 hours. The BMS and inverter system 402 may perform one or more operations described in this disclosure to power the air conditioning device 431, which may consume power at an accelerated rate in high-temperature environments. The vehicle 401 may be deployed when the battery 404 is charged to a maximum energy threshold and returned to a charging station when the depletion of the energy stored in the battery 404 causes the power capacity of the battery 404 to satisfy a minimum energy threshold. As described elsewhere in this disclosure, some embodiments may predict future power outputs of the solar energy generator 406 based on a current geolocation of the vehicle 401 and environmental data associated with the vehicle 401. Similarly, some embodiments may use the geolocation and records of previous power consumption to predict the amount of power that will be consumed by the air conditioning device 431. Upon satisfying the minimum energy threshold, the vehicle 401 may display an indicator on the graphic user interface 442 to instruct a vehicle driver to return the vehicle 401 to a charging station. Alternatively, or in addition, the vehicle 401 may be capable of autonomous driving functionality and may receive instructions to return to the charging station autonomously.

Some embodiments may modify one or more energy thresholds based on a scheduled path or anticipated duration of a vehicle. Modifying an energy threshold may include increasing a maximum energy threshold or decreasing a minimum energy threshold in response to a detected change to the length of a scheduled path or a detected change in the duration that the vehicle will travel along the path. For example, the BMS and inverter system 402 may receive, via an API message or a user interface, a message indicating that an anticipated path will require five hours of travel time for the vehicle 401. In response, the BMS and inverter system 402 may set a maximum energy threshold to be X % of a maximum power capacity based on a function that defaults to having the minimum energy threshold at a lesser value than the maximum energy threshold, such as a value less than 25%, a value less than 10%, or 0%. For example, some embodiments may determine X using a function that calculates X as the product of the number of hours that a vehicle is traveling and a value Y, where Y may be a proportionality constant. Various other functions may be used, such as a logarithmic function, a trigonometric function, an exponential function, or the like.

Computer System

Figure 5:
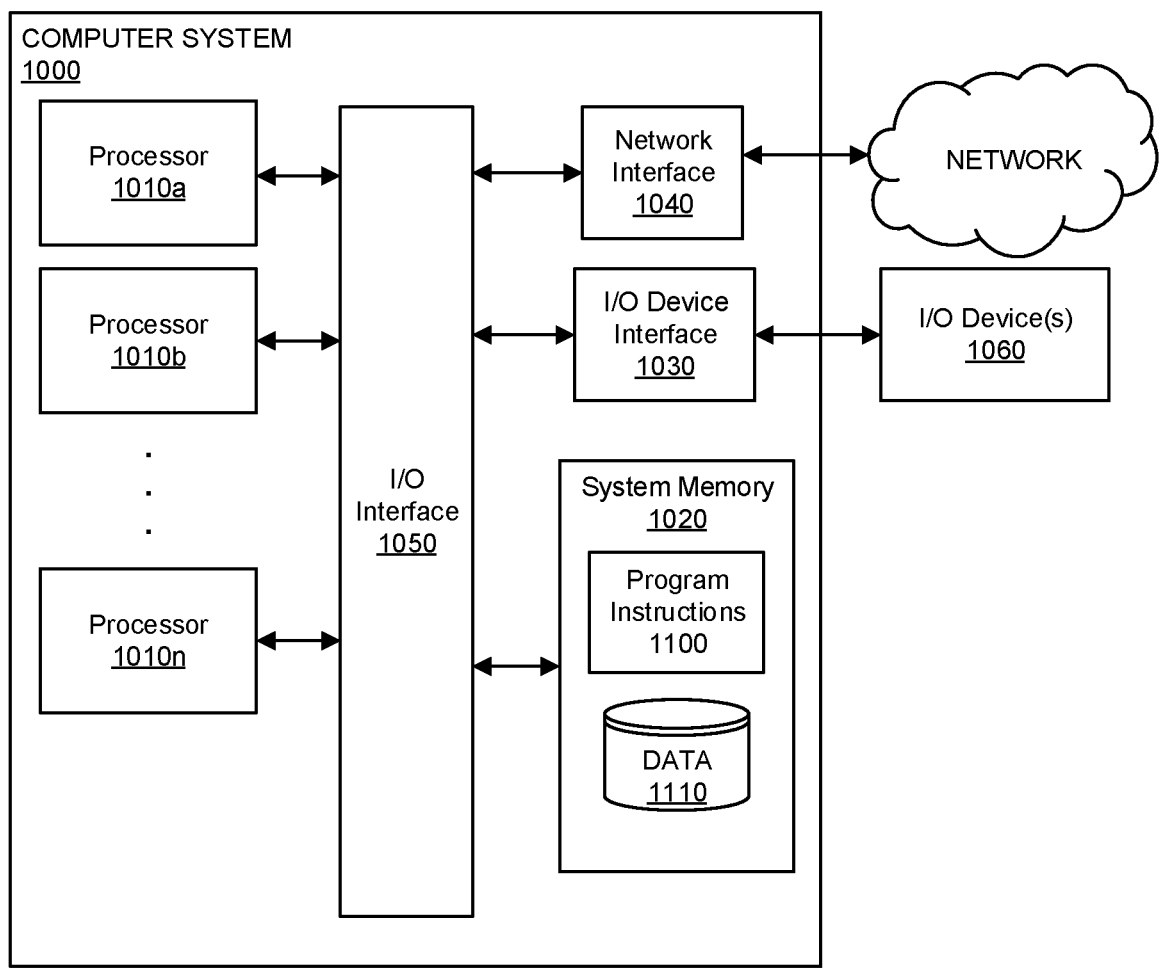
FIG. 5 shows an exemplary computing system by which the present techniques may be implemented in accordance with some embodiments.

FIG. 5 shows an exemplary computing system 1000 by which the present techniques may be implemented in accordance with some embodiments. Various portions of systems and methods described herein, may include or be executed on one or more computer systems similar to computing system 1000. Further, processes and modules described herein may be executed by one or more processing systems similar to that of computing system 1000.

Computing system 1000 may include one or more processors (e.g., processors 1010a-1010n) coupled to system memory 1020, an input/output I/O device interface 1030, and a network interface 1040 via an input/output (I/O) interface 1050. A processor may include a single processor or a plurality of processors (e.g., distributed processors). A processor may be any suitable processor capable of executing or otherwise performing instructions. A processor may include a central processing unit (CPU) that carries out program instructions to perform the arithmetical, logical, and input/output operations of computing system 1000. A processor may execute code (e.g., processor firmware, a protocol stack, a database management system, an operating system, or a combination thereof) that creates an execution environment for program instructions. A processor may include a programmable processor. A processor may include general or special purpose microprocessors. A processor may receive instructions and data from a memory (e.g., system memory 1020). Computing system 1000 may be a uni-processor system including one processor (e.g., processor 1010a), or a multi-processor system including any number of suitable processors (e.g., 1010a-1010n). Multiple processors may be employed to provide for parallel or sequential execution of one or more portions of the techniques described herein. Processes, such as logic flows, described herein may be performed by one or more programmable processors executing one or more computer programs to perform functions by operating on input data and generating corresponding output. Processes described herein may be performed by, and apparatus can also be implemented as, special purpose logic circuitry, e.g., a vision processing unit (VPU), a neuromorphic complementary metal-oxide-semiconductor (CMOS) chip, an FPGA (field programmable gate array), a PGA (programmable gate array), or an ASIC (application specific integrated circuit) such as a tensor processing unit (TPU). Computing system 1000 may include a plurality of computing devices (e.g., distributed computer systems) to implement various processing functions.

I/O device interface 1030 may provide an interface for connection of one or more I/O devices 1060 to computing system 1000. I/O devices may include devices that receive input (e.g., from a user) or output information (e.g., to a user). I/O devices 1060 may include, for example, graphical user interface presented on displays (e.g., a cathode ray tube (CRT) or liquid crystal display (LCD) monitor), pointing devices (e.g., a computer mouse or trackball), keyboards, keypads, touchpads, scanning devices, voice recognition devices, gesture recognition devices, printers, audio speakers, microphones, cameras, or the like. I/O devices 1060 may be connected to computing system 1000 through a wired or wireless connection. I/O devices 1060 may be connected to computing system 1000 from a remote location. I/O devices 1060 located on remote computer system, for example, may be connected to computing system 1000 via a network and network interface 1040.

Network interface 1040 may include a network adapter that provides for connection of computing system 1000 to a network. Network interface may 1040 may facilitate data exchange between computing system 1000 and other devices connected to the network. Network interface 1040 may support wired or wireless communication. The network may include an electronic communication network, such as the Internet, a local area network (LAN), a wide area network (WAN), a cellular communications network, or the like.

System memory 1020 may be configured to store program instructions 1100 or data 1110. Program instructions 1100 may be executable by a processor (e.g., one or more of processors 1010a-1010n) to implement one or more embodiments of the present techniques. Instructions 1100 may include modules of computer program instructions for implementing one or more techniques described herein with regard to various processing modules. Program instructions may include a computer program (which in certain forms is known as a program, software, software application, script, or code). A computer program may be written in a programming language, including compiled or interpreted languages, or declarative or procedural languages. A computer program may include a unit suitable for use in a computing environment, including as a stand-alone program, a module, a component, or a subroutine. A computer program may or may not correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one or more computer processors located locally at one site or distributed across multiple remote sites and interconnected by a communication network.

System memory 1020 may include a tangible program carrier having program instructions stored thereon. A tangible program carrier may include a non-transitory computer readable storage medium. A non-transitory, computer-readable storage medium may include a machine readable storage device, a machine readable storage substrate, a memory device, or any combination thereof. Non-transitory computer readable storage medium may include non-volatile memory (e.g., flash memory, ROM, PROM, EPROM, EEPROM memory), volatile memory (e.g., random access memory (RAM), static random access memory (SRAM), synchronous dynamic RAM (SDRAM)), bulk storage memory (e.g., CD-ROM or DVD-ROM, hard-drives), or the like. System memory 1020 may include a non-transitory computer readable storage medium that may have program instructions stored thereon that are executable by a computer processor (e.g., one or more of processors 1010a-1010n) to cause the subject matter and the functional operations described herein. A memory (e.g., system memory 1020) may include a single memory device or a plurality of memory devices (e.g., distributed memory devices). Instructions or other program code to provide the functionality described herein may be stored on a tangible, non-transitory computer readable media. In some cases, the entire set of instructions may be stored concurrently on the media, or in some cases, different parts of the instructions may be stored on the same media at different times.

I/O interface 1050 may be configured to coordinate I/O traffic between processors 1010a-1010n, system memory 1020, network interface 1040, I/O devices 1060, or other peripheral devices. I/O interface 1050 may perform protocol, timing, or other data transformations to convert data signals from one component (e.g., system memory 1020) into a format suitable for use by another component (e.g., processors 1010a-1010n). I/O interface 1050 may include support for devices attached through various types of peripheral buses, such as a variant of the Peripheral Component Interconnect (PCI) bus standard or the Universal Serial Bus (USB) standard.

Embodiments of the techniques described herein may be implemented using a single instance of computing system 1000 or multiple computing systems 1000 configured to host different portions or instances of embodiments. Multiple computing systems 1000 may provide for parallel or sequential processing/execution of one or more portions of the techniques described herein.

Those skilled in the art will appreciate that computing system 1000 is merely illustrative and is not intended to limit the scope of the techniques described herein. Computing system 1000 may include any combination of mobile computing devices or software that may perform or otherwise provide for the performance of the techniques described herein. For example, computing system 1000 may include or be a combination of a cloud-computing system, a data center, a server rack, a server, a virtual server, a desktop computer, a laptop computer, a tablet computer, a server device, a client device, a mobile telephone, a personal digital assistant (PDA), a mobile audio or video player, a game console, a vehicle-mounted computer, or a Global Positioning System (GPS), or the like. Computing system 1000 may also be connected to other devices that are not illustrated, or may operate as a stand-alone system. In addition, the functionality provided by the illustrated components may, in some embodiments, be combined in fewer components or distributed in additional components. Similarly, in some embodiments, the functionality of some of the illustrated components may not be provided or other additional functionality may be available.

Those skilled in the art will also appreciate that while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1000 may be transmitted to computer system 1000 via transmission media or signals such as electrical, electromagnetic, or digital signals, conveyed via a communication medium such as a network or a wireless link. Various embodiments may further include receiving, sending, or storing instructions or data implemented in accordance with the foregoing description upon a computer-accessible medium. Accordingly, the present techniques may be practiced with other computer system configurations.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, notwithstanding use of the singular term "medium," the instructions may be distributed on different storage devices associated with different computing devices, for instance, with each computing device having a different subset of the instructions, an implementation consistent with usage of the singular term "medium" herein. In some cases, third party content delivery networks may host some or all of the information conveyed over networks, in which case, to the extent information (e.g., content) is said to be supplied or otherwise provided, the information may be provided by sending instructions to retrieve that information from a content delivery network.

The reader should appreciate that the present application describes several independently useful techniques. Rather than separating those techniques into multiple isolated patent applications, applicants have grouped these techniques into a single document because their related subject matter lends itself to economies in the application process. But the distinct advantages and aspects of such techniques should not be conflated. In some cases, embodiments address all of the deficiencies noted herein, but it should be understood that the techniques are independently useful, and some embodiments address only a subset of such problems or offer other, unmentioned benefits that will be apparent to those of skill in the art reviewing the present disclosure. Due to costs constraints, some techniques disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such techniques or all aspects of such techniques.

It should be understood that the description and the drawings are not intended to limit the present techniques to the particular form disclosed, but to the contrary, the intention is to cover all modifications, equivalents, and alternatives falling within the spirit and scope of the present techniques as defined by the appended claims. Further modifications and alternative embodiments of various aspects of the techniques will be apparent to those skilled in the art in view of this description. Accordingly, this description and the drawings are to be construed as illustrative only and are for the purpose of teaching those skilled in the art the general manner of carrying out the present techniques. It is to be understood that the forms of the present techniques shown and described herein are to be taken as examples of embodiments. Elements and materials may be substituted for those illustrated and described herein, parts and processes may be reversed or omitted, and certain features of the present techniques may be utilized independently, all as would be apparent to one skilled in the art after having the benefit of this description of the present techniques. Changes may be made in the elements described herein without departing from the spirit and scope of the present techniques as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an element" or "a element" includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Similarly, reference to "a computer system" performing step A and "the computer system" performing step B can include the same computing device within the computer system performing both steps or different computing devices within the computer system performing steps A and B. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. Limitations as to sequence of recited steps should not be read into the claims unless explicitly specified, e.g., with explicit language like "after performing X, performing Y," in contrast to statements that might be improperly argued to imply sequence limitations, like "performing X on items, performing Y on the X' ed items," used for purposes of making claims more readable rather than specifying sequence. Statements referring to "at least Z of A, B, and C," and the like (e.g., "at least Z of A, B, or C"), refer to at least Z of the listed categories (A, B, and C) and do not require at least Z units in each category. Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device. Features described with reference to geometric constructs, like "parallel," "perpendicular/orthogonal," "square", "cylindrical," and the like, should be construed as encompassing items that substantially embody the properties of the geometric construct, e.g., reference to "parallel" surfaces encompasses substantially parallel surfaces. The permitted range of deviation from Platonic ideals of these geometric constructs is to be determined with reference to ranges in the specification, and where such ranges are not stated, with reference to industry norms in the field of use, and where such ranges are not defined, with reference to industry norms in the field of manufacturing of the designated feature, and where such ranges are not defined, features substantially embodying a geometric construct should be construed to include those features within 15% of the defining attributes of that geometric construct. The terms "first", "second", "third," "given" and so on, if used in the claims, are used to distinguish or otherwise identify, and not to show a sequential or numerical limitation. As is the case in ordinary usage in the field, data structures and formats described with reference to uses salient to a human need not be presented in a human-intelligible format to constitute the described data structure or format, e.g., text need not be rendered or even encoded in Unicode or ASCII to constitute text; images, maps, and data-visualizations need not be displayed or decoded to constitute images, maps, and data-visualizations, respectively; speech, music, and other audio need not be emitted through a speaker or decoded to constitute speech, music, or other audio, respectively. Computer implemented instructions, commands, and the like are not limited to executable code and can be implemented in the form of data that causes functionality to be invoked, e.g., in the form of arguments of a function or API call. To the extent bespoke noun phrases are used in the claims and lack a self-evident construction, the definition of such phrases may be recited in the claim itself, in which case, the use of such bespoke noun phrases should not be taken as invitation to impart additional limitations by looking to the specification or extrinsic evidence.

In this patent, to the extent any U.S. patents, U.S. patent applications, or other materials (e.g., articles) have been incorporated by reference, the text of such materials is only incorporated by reference to the extent that no conflict exists between such material and the statements and drawings set forth herein. In the event of such conflict, the text of the present document governs, and terms in this document should not be given a narrower reading in virtue of the way in which those terms are used in other materials incorporated by reference.

The present techniques will be better understood with reference to the following enumerated embodiments:

1. A device, comprising: a non-transitory, computer-readable medium storing instructions that, when executed by one or more processors of an embedded computer system, effectuate operations comprising: determining, with the embedded computer system, a power capacity of a battery carried by a vehicle; predicting, with the embedded computer system, a first set of values indicative of amounts of power to be stored during a time interval by the battery, the power to be stored being generated during the time interval by a renewable energy generator carried by the vehicle; predicting, with the embedded computer system, a second set of values indicative of amounts of energy to be consumed from the battery during the time interval, the energy consumed being predicted based on previous consumption of energy by the vehicle; determining, with the embedded computer system, a score based on the power capacity of the battery, the first set of values indicative of amounts of power to be stored, and the second set of values indicative of amounts of energy to be consumed; determining, with the embedded computer system, whether the score satisfies a threshold; and in response to a determination that the score satisfies the threshold, activating, with the embedded computer system, an internal combustion engine to charge to the battery.

2. The device of embodiment 1, wherein: the vehicle is a motor vehicle comprising a chassis battery; the battery is a house battery of the motor vehicle; activating the internal combustion engine comprises charging the house battery with the internal combustion engine without charging the chassis battery; the previous consumption of energy is stored in a set of records indicating previous power consumption values, wherein the set of records indicates amounts of energy previously used by a set of devices connected to a set of electrical outlets of the vehicle, wherein the set of devices comprises a set of air conditioning devices, a set of heating devices, and a set of water pumps; predicting the second set of values comprises: predicting, based on the set of records indicating previous power consumption values, a first set of durations during which the set of air conditioning devices will be active, a second set of durations during which the set of heating devices will be active, and a third set of durations during which the set of water pumps will be active; increasing a first subset of the second set of values by a first amount associated with the set of air conditioning devices during the first set of durations; increasing a second subset of the second set of values by a second amount associated with the set of heating devices during the second set of durations; and increasing a third subset of the second set of values by a third amount associated with the set of water pumps during the third set of durations.

3. The device of embodiment 2, wherein activating the internal combustion engine comprises sending an instruction from a battery management system of the vehicle to an inverter in electrical contact with the house battery and the internal combustion engine, wherein the instruction is sent via a controller area network bus of the vehicle.

4. The device of any of embodiments 1 to 3, wherein the vehicle is a watercraft, and wherein the renewable energy generator is a first renewable energy generator, and wherein the first renewable energy generator comprises a wind turbine, the operations further comprising: obtaining an scheduled path for the watercraft during the time interval, wherein the scheduled path comprises a geolocation associated with a first time of the time interval; determining a predicted ship velocity associated with the geolocation based on the scheduled path; predicting a first wind speed associated with the geolocation; determining a shared vector component between the first wind speed and the predicted ship velocity; and determining a value of the first set of values, wherein the value is a power output associated with the first time, and wherein determining the power output comprises using a function that computes a cube of the shared vector component.

5. The device of any of embodiments 1 to 5, wherein the threshold is a first threshold, and wherein activating the internal combustion engine comprises activating the internal combustion engine at a first time, the operations further comprising: determining, at a second time, a second power output indicating power provided by the renewable energy generator; determining whether the second power output satisfies a second threshold of the battery; and in response to a determination that the second power output satisfies the second threshold of the battery, increasing an amount of electrical power provided to a first computing node of a peer-to-peer computing nodes executing program instructions comprising: obtaining a target hash of a block of a blockchain stored on the peer-to-peer computing nodes; generating a hash value; and based on a determination that the hash value satisfies a set of criteria of the target hash, adding a new block to the blockchain.

6. The device of any of embodiments 1 to 6, wherein: determining the score comprises: determining a set of differences by determining differences between the first set of values and the second set of values, wherein each respective difference of the set of differences is associated with a different time of the time interval; predicting a first quantity indicating an energy change by integrating the set of differences over the time interval; determining a sum of the first quantity and the power capacity; and determining the score based on the sum; and activating the internal combustion engine comprises: predicting a first time of the time interval during which the score satisfies the threshold; and activating the internal combustion engine during the first time.

7. The device of embodiment 6, the operations further comprising obtaining a weather forecast for a geolocation of the vehicle, wherein predicting the first set of values comprises predicting amounts of power to be delivered to the battery by the renewable energy generator over the time interval based on the weather forecast, the predicted first set of values varying over the time interval based on weather changes indicated by the weather forecast.

8. The device of any of embodiments 1 to 7, wherein predicting the first set of values comprises: obtaining a geolocation of the vehicle; requesting, via a network, a weather forecast during the time interval at the geolocation, wherein the weather forecast comprises subsets of a set of weather model values, and wherein each subset of weather model values correspond with a different time of the time interval; and predicting the first set of values by, for each respective subset of the set of weather model values, determining a respective power output of the first set of values based on the respective subset of the set of weather model values associated with a respective duration of the time interval.

9. The device of embodiment 8, wherein: the geolocation is a first geolocation; the renewable energy generator comprises a solar energy generator; the set of weather model values comprises a set of solar irradiance predictions; obtaining the first geolocation comprises obtaining a path of geolocations indicating locations to be visited by the vehicle; for each respective geolocation of the path of geolocations: the respective geolocation corresponds with a respective time of the time interval; and the respective geolocation is associated with a respective solar irradiance prediction of the set of solar irradiance predictions; and predicting the first set of values comprises determining the first set of values based on the set of solar irradiance predictions and a set of solar panel parameters of a solar power model used to predict an amount of power produced by the solar energy generator, wherein a first solar panel parameter of the set of solar panel parameters is used as a scaling factor for a solar irradiance prediction of the set of solar irradiance predictions.

10. The device of any of embodiments 1 to 9, wherein determining the first set of values comprises: obtaining a geolocation of the vehicle; retrieving, from a set of records indicating previous power outputs, a plurality of power outputs associated with the geolocation and associated with a set of clock times of the time interval, wherein: each clock time of the set of clock times is within a shared time bin as a respective clock time of the time interval; determining a respective measure of central tendency for each subset of values associated with power outputs of the plurality of power outputs binned to a same clock time of the set of clock times; and determining the first set of values comprises determining the first set of values based on the measures of central tendency.

11. The device of any of embodiments 1 to 10, the operations further comprising: obtaining a set of sensor measurements from a set of sensors attached to the vehicle, wherein the set of sensor measurements comprises a temperature; and obtaining a recurrent neural network and a set of model parameters to determine the second set of values based on the set of sensor measurements, wherein predicting the second set of values comprises predicting the second set of values with the recurrent neural network based on the set of sensor measurements.

12. The device of embodiment 11, wherein the set of sensor measurements is a first set of sensor measurements, the operations further comprising: retrieving a second set of sensor measurements, wherein each subset of the second set of sensor measurements is associated with a respective power consumption of a set of records indicating previous power consumption values; configuring the set of model parameters by training the recurrent neural network to predict power consumption values based on the second set of sensor measurements; and storing the set of model parameters in a local memory of a computing device attached to the vehicle.

13. The device of any of embodiments 1 to 12, wherein activating the internal combustion engine comprises: determining whether a scheduled activation time is within a permitted generator activation interval; and based on a determination that the scheduled activation time is within the permitted generator activation interval, activating the internal combustion engine.

14. The device of any of embodiments 1 to 13, the operations further comprising: obtaining a battery temperature measurement indicating a temperature of the battery; determining a predicted temperature increase based on the battery temperature measurement; determining whether a temperature threshold is satisfied based on the predicted temperature increase; in response to a determination that the temperature threshold is satisfied, predicting a set of charging delays; and reducing the first set of values based on the set of charging delays.

15. The device of any of embodiments 1 to 14, wherein activating the internal combustion engine comprises: sending a notification message to a mobile computing device to indicate a recommendation to activate the internal combustion engine; receiving a response message from the mobile computing device; and in response to obtaining the response message, activating the internal combustion engine.

16. The device of any of embodiments 1 to 15, the operations further comprising: obtaining a set of sensor measurements from a set of sensors attached to the vehicle, wherein: determining the second set of values comprises determining at least one value of the second set of values based on the set of sensor measurements; and the set of sensor measurements is stored on a local memory of a computing device attached to the vehicle; determining whether a wireless connection between a server and the computing device comprising the local memory is available; in response to a determination that the wireless connection is available, sending the set of sensor measurements to the server via the wireless connection; and deleting a version of the set of sensor measurements from the local memory.

17. The device of any of embodiments 1 to 16, wherein determining the second set of values comprises: identifying a set of occupants in the vehicle, wherein the set of occupants comprises an identified occupant; retrieving a set of occupant records for the set of occupants, wherein the set of occupant records comprises an occupant record associated with the identified occupant; and retrieving power consumption values associated with the identified occupant from the set of records indicating previous power consumption values, wherein determining the second set of values comprises determining the second set of values based on the power consumption values associated with the identified occupant.

18. The device of any of embodiments 1 to 17, further comprising: determining that a maximum power capacity of the battery has decreased; and performing a calibration operation to determine an updated value for the threshold, wherein determining the score comprises determining the score based on the updated value.

19. The device of any of embodiments 1 to 18, wherein the score is a first score, and wherein the threshold is a first threshold, and wherein predicting the second set of values comprises: predicting multiple sets of power consumption values for the time interval using a statistical model based on a geolocation of the vehicle; obtaining an upper band threshold that is greater than 0.5 and less than 1.0; obtaining a lower band threshold that is greater than 0 and less than 0.5; for each respective time of a set of times of the time interval: determining a respective subset of power consumption values of the multiple sets of power consumption values, wherein each power consumption value of the respective subsets is associated with the respective time; determining a lower band value of a third set of values associated with power consumption values by selecting a value of the respective subset of values based on the lower band threshold; determining an upper band value of a fourth set of values associated with power consumption values by selecting a value of the respective subset of values based on the upper band threshold; determining a lower band score based on the first set of values and set of power consumption values; and determining an upper band score based on the first set of values and the second set of values associated with power consumption, wherein determining that the score satisfies the first threshold comprises determining that at least one of the lower band score or the upper band score satisfies the first threshold.

20. The device of any of embodiments 1 to 19, wherein the vehicle is stationary, the operations further comprises: obtaining a geolocation of the vehicle, wherein: predicting the first set of values comprises predicting, using a statistical model, a third set of values associated with power outputs and predicting a second set of values associated with power outputs based on the geolocation; predicting the second set of values comprises predicting, using a statistical model, a fourth set of values associated with power consumption and predicting a fifth set of values associated with power consumption based on the geolocation and a set of records indicating previous power consumption values; for each respective time of the time interval: a power output of the first set of values associated with power outputs associated with the respective time is less than a power output of the second set of values associated with power outputs associated with the respective time; an power consumption of the first set of values associated with power consumption associated with the respective time is less than an power consumption of the second set of values associated with power consumption associated with the respective time; determining a cycle count of the battery; increasing the threshold based on the cycle count; determining whether the score satisfies the threshold comprises: determining whether a scheduled activation time is within a permitted generator activation interval; activating the internal combustion engine comprises; generating a linear system indicating a set of linear relationships between a first power output of the renewable energy generator, a second power output of the internal combustion engine, and a first power consumption; numerically solving the linear system to determine a value for the first power output; determining an operational parameter based on the first power output; and activating the internal combustion engine based on the operational parameter.

21. The device of any of embodiments 1 to 20, wherein predicting the second set of values further comprises steps for predicting the second set of values.

22. The device of any of embodiments 1 to 21, wherein predicting the first set of values further comprises steps for predicting the first set of values.

23. The device of any of embodiments 1 to 22, wherein the device comprises the vehicle, and wherein the embedded computer system is carried by the vehicle, and wherein the vehicle is a wheeled motor vehicle or a watercraft.

24. A method comprising any of the operations of embodiments 1 to 23.

25. A non-transitory, computer-readable media storing instructions that, when executed by one or more processors, effectuate operations comprising those of any of embodiments 1 to 23.

What is claimed is:

1. A method, comprising:
obtaining, with a computer system, a parameter of a battery carried by a vehicle;
predicting, with the computer system, a first set of values indicative of amounts of energy to be stored during a time interval by the battery, the energy to be stored being generated during the time interval by a renewable energy generator carried by the vehicle;
predicting, with the computer system, a second set of values indicative of amounts of energy to be consumed from the battery during the time interval, the energy consumed being predicted based on previous consumption of energy by the vehicle;
determining, with the computer system, a score based on the first set of values indicative of amounts of energy to be stored, and the second set of values indicative of amounts of energy to be consumed;
determining, with the computer system, whether the score satisfies a threshold; and
in response to a determination that the score satisfies the threshold, activating, with the computer system, a non-renewable energy generator to charge to the battery.

2. The method of claim 1, wherein:
the computer system is an embedded computer system of the vehicle;
the parameter is a capacity of the battery and the score is based on the capacity of the battery;
the vehicle is a motor vehicle comprising a chassis battery;
the battery is a house battery of the motor vehicle;
activating the non-renewable energy generator comprises charging the house battery with an internal combustion engine without charging the chassis battery;
the previous consumption of energy is stored in a set of records indicating previous power energy consumption values, wherein the set of records indicates amounts of energy previously used by a set of devices connected to a set of electrical outlets of the vehicle, wherein the set of devices comprises a set of air conditioning devices, a set of heating devices, and a set of water pumps;
the amounts of energy to be stored during the time interval by the battery are expressed as amounts of power; and
predicting the second set of values comprises:
predicting, based on the set of records indicating previous energy consumption values, a first set of durations during which the set of air conditioning devices will be active, a second set of durations during which the set of heating devices will be active, and a third set of durations during which the set of water pumps will be active;
increasing a first subset of the second set of values by a first amount associated with the set of air conditioning devices during the first set of durations;
increasing a second subset of the second set of values by a second amount associated with the set of heating devices during the second set of durations; and
increasing a third subset of the second set of values by a third amount associated with the set of water pumps during the third set of durations.

3. The method of claim 2, wherein activating the non-renewable energy generator comprises sending an instruction from a battery management system of the vehicle to an inverter in electrical contact with the house battery and the non-renewable energy generator, wherein the instruction is sent via a controller area network bus of the vehicle.

4. The method of claim 1, wherein the vehicle is a watercraft, and wherein the renewable energy generator is a first renewable energy generator, and wherein the first renewable energy generator comprises a wind turbine, the method further comprising:
obtaining an scheduled path for the watercraft during the time interval, wherein the scheduled path comprises a geolocation associated with a first time of the time interval;
determining a predicted ship velocity associated with the geolocation based on the scheduled path;
predicting a first wind speed associated with the geolocation;
determining a shared vector component between the first wind speed and the predicted ship velocity; and
determining a value of the first set of values, wherein the value is a power output associated with the first time, and wherein determining the power output comprises using a function that computes a cube of the shared vector component.

5. The method of claim 1, wherein the threshold is a first threshold, and wherein activating the non-renewable energy generator comprises activating the non-renewable energy generator at a first time, the method further comprising:
   determining, at a second time, a second power output indicating power provided by the renewable energy generator;
   determining whether the second power output satisfies a second threshold of the battery; and
   in response to a determination that the second power output satisfies the second threshold of the battery, increasing an amount of electrical power provided to a first computing node of a peer-to-peer computing nodes executing program instructions to mine a cryptocurrency or cryptographic token.

6. The method of claim 1, wherein:
   determining the score comprises:
      determining a set of differences by determining differences between the first set of values and the second set of values, wherein each respective difference of the set of differences is associated with a different time of the time interval;
      predicting a first quantity indicating an energy change by integrating the set of differences over the time interval;
      determining a sum of the first quantity and the capacity; and
      determining the score based on the sum; and
   activating the non-renewable energy generator comprises:
      predicting a first time of the time interval during which the score satisfies the threshold; and
      activating the non-renewable energy generator during the first time.

7. The method device of claim 6, the method further comprising obtaining a weather forecast for a geolocation of the vehicle, wherein predicting the first set of values comprises predicting amounts of power to be delivered to the battery by the renewable energy generator over the time interval based on the weather forecast, the predicted first set of values varying over the time interval based on weather changes indicated by the weather forecast.

8. The method device of claim 1, wherein predicting the first set of values comprises:
   obtaining a geolocation of the vehicle;
   requesting, via a network, a weather forecast during the time interval at the geolocation, wherein the weather forecast comprises subsets of a set of weather model values, and wherein each subset of weather model values correspond with a different time of the time interval; and
   predicting the first set of values by, for each respective subset of the set of weather model values, determining a respective power output of the first set of values based on the respective subset of the set of weather model values associated with a respective duration of the time interval.

9. The method device of claim 8, wherein:
   the geolocation is a first geolocation;
   the renewable energy generator comprises a solar energy generator;
   the set of weather model values comprises a set of solar irradiance predictions;
   obtaining the first geolocation comprises obtaining a path of geolocations indicating locations to be visited by the vehicle;
   for each respective geolocation of the path of geolocations:
      the respective geolocation corresponds with a respective time of the time interval; and
      the respective geolocation is associated with a respective solar irradiance prediction of the set of solar irradiance predictions; and
   predicting the first set of values comprises determining the first set of values based on the set of solar irradiance predictions and a set of solar panel parameters of a solar power model used to predict an amount of power produced by the solar energy generator, wherein a first solar panel parameter of the set of solar panel parameters is used as a scaling factor for a solar irradiance prediction of the set of solar irradiance predictions.

10. The method of claim 1, wherein determining the first set of values comprises:
   obtaining a geolocation of the vehicle;
   retrieving, from a set of records indicating previous power outputs, a plurality of power outputs associated with the geolocation and associated with a set of clock times of the time interval, wherein:
      each clock time of the set of clock times is within a shared time bin as a respective clock time of the time interval;
      determining a respective measure of central tendency for each subset of values associated with power outputs of the plurality of power outputs binned to a same clock time of the set of clock times; and
      determining the first set of values comprises determining the first set of values based on the measures of central tendency.

11. The method of claim 1, the method operations further comprising:
   obtaining a set of sensor measurements from a set of sensors attached to the vehicle, wherein the set of sensor measurements comprises a temperature; and
   obtaining a neural network and a set of model parameters to determine the second set of values based on the set of sensor measurements, wherein predicting the second set of values comprises predicting the second set of values with the neural network based on the set of sensor measurements.

12. The method of claim 11, wherein the set of sensor measurements is a first set of sensor measurements, the method further comprising:
   retrieving a second set of sensor measurements, wherein each subset of the second set of sensor measurements is associated with a respective energy consumption of a set of records indicating previous energy consumption values;
   configuring the set of model parameters by training the neural network to predict energy consumption values based on the second set of sensor measurements; and
   storing the set of model parameters in a local memory of a computing device attached to the vehicle.

13. The method device of claim 1, wherein activating the non-renewable energy generator engine comprises:
   determining whether a scheduled activation time is within a permitted generator activation interval; and
   based on a determination that the scheduled activation time is within the permitted generator activation interval, activating an internal combustion engine.

14. The method of claim 1, the method operations further comprising:
obtaining a battery temperature measurement indicating a temperature of the battery;
determining a predicted temperature increase based on the battery temperature measurement;
determining whether a temperature threshold is satisfied based on the predicted temperature increase;
in response to a determination that the temperature threshold is satisfied, predicting a set of charging delays; and
reducing the first set of values based on the set of charging delays.

15. The method deice of claim 1, wherein activating the non-renewable energy generator comprises:
sending a notification message to a mobile computing device to indicate a recommendation to activate the non-renewable energy generator;
receiving a response message from the mobile computing device; and
in response to obtaining the response message, activating the non-renewable energy generator.

16. The method of claim 1, the method further comprising:
obtaining a set of sensor measurements from a set of sensors attached to the vehicle, wherein:
determining the second set of values comprises determining at least one value of the second set of values based on the set of sensor measurements; and
the set of sensor measurements is stored on a local memory of a computing device attached to the vehicle;
determining whether a wireless connection between a server and the computing device comprising the local memory is available;
in response to a determination that the wireless connection is available, sending the set of sensor measurements to the server via the wireless connection; and
deleting a version of the set of sensor measurements from the local memory.

17. The method of claim 1, wherein determining the second set of values comprises:
identifying a set of occupants in the vehicle, wherein the set of occupants comprises an identified occupant;
retrieving a set of occupant records for the set of occupants, wherein the set of occupant records comprises an occupant record associated with the identified occupant; and
retrieving energy consumption values associated with the identified occupant from the set of records indicating previous energy consumption values, wherein determining the second set of values comprises determining the second set of values based on the energy consumption values associated with the identified occupant.

18. The method of claim 1, further comprising:
determining that a maximum capacity of the battery has decreased; and
performing a calibration operation to determine an updated value for the threshold, wherein determining the score comprises determining the score based on the updated value.

19. The method of claim 1, wherein the score is a first score, and wherein the threshold is a first threshold, and wherein predicting the second set of values comprises:
predicting multiple sets of energy consumption values for the time interval using a statistical model based on a geolocation of the vehicle;
obtaining an upper band threshold that is greater than 0.5 and less than 1.0;
obtaining a lower band threshold that is greater than 0 and less than 0.5;
for each respective time of a set of times of the time interval:
determining a respective subset of energy consumption values of the multiple sets of energy consumption values, wherein each energy consumption value of the respective subsets is associated with the respective time;
determining a lower band value of a third set of values associated with energy consumption values by selecting a value of the respective subset of values based on the lower band threshold; and
determining an upper band value of a fourth set of values associated with energy consumption values by selecting a value of the respective subset of values based on the upper band threshold;
determining a lower band score based on the first set of values and set of energy consumption values; and
determining an upper band score based on the first set of values and the second set of values associated with energy consumption, wherein determining that the score satisfies the first threshold comprises determining that at least one of the lower band score or the upper band score satisfies the first threshold.

20. The method of claim 1, wherein the vehicle is stationary, and the method further comprises:
obtaining a geolocation of the vehicle, wherein:
predicting the first set of values comprises predicting, using a statistical model, a third set of values associated with energy outputs and predicting a second set of values associated with energy outputs based on the geolocation;
predicting the second set of values comprises predicting, using a statistical model, a fourth set of values associated with energy consumption and predicting a fifth set of values associated with energy consumption based on the geolocation and a set of records indicating previous energy consumption values;
for each respective time of the time interval:
a energy output of the first set of values associated with energy outputs associated with the respective time is less than a energy output of the second set of values associated with energy outputs associated with the respective time;
an energy consumption of the first set of values associated with energy consumption associated with the respective time is less than an energy consumption of the second set of values associated with energy consumption associated with the respective time;
determining a cycle count of the battery;
increasing the threshold based on the cycle count;
determining whether the score satisfies the threshold comprises:
determining whether a scheduled activation time is within a permitted generator activation interval;
activating the non-renewable energy generator comprises;
generating a linear system indicating a set of linear relationships between a first energy output of the renewable energy generator, a second energy output of the non-renewable energy generator, and a first energy consumption;
numerically solving the linear system to determine a value for the first energy output;

determining an operational parameter based on the first energy output; and activating the non-renewable energy generator based on the operational parameter.

* * * * *